United States Patent
Miller et al.

(10) Patent No.: US 8,220,330 B2
(45) Date of Patent: *Jul. 17, 2012

(54) VERTICALLY INTEGRATED MEMS SENSOR DEVICE WITH MULTI-STIMULUS SENSING

(75) Inventors: Todd F. Miller, Scottsdale, AZ (US); Yizhen Lin, Gilbert, AZ (US); David J. Monk, Mesa, AZ (US); Woo Tae Park, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 307 days.

This patent is subject to a terminal disclaimer.

(21) Appl. No.: 12/609,332

(22) Filed: Oct. 30, 2009

(65) Prior Publication Data
US 2010/0242603 A1  Sep. 30, 2010

Related U.S. Application Data

(63) Continuation-in-part of application No. 12/409,920, filed on Mar. 24, 2009.

(51) Int. Cl.
*G01P 15/125* (2006.01)
*G01P 3/04* (2006.01)
*G01P 1/02* (2006.01)

(52) U.S. Cl. ............... 73/514.32; 73/510; 73/493

(58) Field of Classification Search .......... 73/514.32, 73/493, 514.29, 514.16, 514.36, 514.38, 73/510, 511
See application file for complete search history.

(56) References Cited

U.S. PATENT DOCUMENTS

| | | | |
|---|---|---|---|
| 6,938,334 B2 | 9/2005 | Yu | |
| 6,956,268 B2 | 10/2005 | Faris | |
| 7,159,454 B2 * | 1/2007 | Tatraux-Paro et al. | 73/146 |
| 7,223,624 B2 * | 5/2007 | Wu et al. | 438/52 |
| 7,243,561 B2 * | 7/2007 | Ishigami et al. | 73/866.1 |
| 7,247,246 B2 | 7/2007 | Nasiri et al. | |
| 7,258,011 B2 * | 8/2007 | Nasiri et al. | 73/514.32 |
| 7,276,789 B1 | 10/2007 | Cohn et al. | |
| 7,322,236 B2 * | 1/2008 | Combi et al. | 73/488 |
| 7,331,212 B2 * | 2/2008 | Manlove et al. | 73/12.01 |
| 7,600,426 B2 * | 10/2009 | Savolainen et al. | 73/384 |
| 7,642,923 B2 * | 1/2010 | Ploechinger | 340/600 |
| 7,658,109 B2 * | 2/2010 | Fukuda et al. | 73/514.32 |
| 7,793,544 B2 * | 9/2010 | Merassi et al. | 73/514.32 |
| 7,858,440 B2 * | 12/2010 | Pressel et al. | 438/109 |
| 2006/0179940 A1 | 8/2006 | Liu et al. | |
| 2006/0219006 A1 | 10/2006 | Nasiri et al. | |
| 2008/0096301 A1 | 4/2008 | Ramamoorthi et al. | |
| 2008/0196499 A1 | 8/2008 | Li et al. | |
| 2008/0284611 A1 | 11/2008 | Leedy | |
| 2010/0242600 A1 * | 9/2010 | Lin et al. | 73/504.12 |
| 2011/0126632 A1 * | 6/2011 | McNeil et al. | 73/718 |

* cited by examiner

*Primary Examiner* — Helen C. Kwok
(74) *Attorney, Agent, or Firm* — Meschkow & Gresham, P.L.C.

(57) ABSTRACT

A microelectromechanical systems (MEMS) sensor device (184) includes a sensor portion (180) and a sensor portion (182) that are coupled together to form a vertically integrated configuration having a hermetically sealed chamber (270). The sensor portions (180, 182) can be formed utilizing different micromachining techniques, and are subsequently coupled utilizing a wafer bonding technique to form the sensor device (184). The sensor portion (180) includes one or more sensors (186, 188), and the sensor portion (182) includes one or more sensors (236, 238). The sensors (186, 188) are located inside the chamber (270) facing the sensors (236, 238) also located inside the chamber (270). The sensors (186, 188, 236, 238) are configured to sense different physical stimuli, such as motion, pressure, and magnetic field.

18 Claims, 10 Drawing Sheets

VERTICALLY INTEGRATED MEMS SENSOR DEVICE WITH MULTI-STIMULUS SENSING

RELATED INVENTION

The present invention is a continuation in part (CIP) of "Vertically Integrated MEMS Acceleration Transducer," U.S. patent application Ser. No. 12/409,920, filed 24 Mar. 2009, which is incorporated by reference herein.

TECHNICAL FIELD OF THE INVENTION

The present invention relates generally to microelectromechanical systems (MEMS) sensor devices. More specifically, the present invention relates to a vertically integrated MEMS sensor device with multiple stimulus sensing capability.

BACKGROUND OF THE INVENTION

An acceleration transducer, or accelerometer, is a sensor typically utilized for measuring acceleration forces. These forces may be static, like the constant force of gravity, or they can be dynamic, caused by moving or vibrating the accelerometer. An accelerometer may sense acceleration or other phenomena along one, two, or three axes or directions. From this information, the movement or orientation of the device in which the accelerometer is installed can be ascertained. Accelerometers are used in inertial guidance systems, in airbag deployment systems in vehicles, in protection systems for a variety of devices, and many other scientific and engineering systems.

Capacitive-sensing MEMS accelerometer designs are highly desirable for operation in high gravity environments and in miniaturized devices, due to their relatively low cost. Capacitive accelerometers sense a change in electrical capacitance, with respect to acceleration, to vary the output of an energized circuit. One type of capacitive acceleration transducer is capable of detecting movement along one or two axes that are generally parallel to the plane of the transducer package. This type of acceleration transducer uses a movable element that moves substantially parallel to a surface of the substrate to which it is mounted under x-axis and/or y-axis acceleration. Another type of capacitive acceleration transducer has a "teeter-totter" or "see saw" movable element configuration that is capable of detecting movement along an axis that is generally perpendicular to the plane of the transducer package. This type of acceleration transducer uses a movable element or plate that rotates under z-axis acceleration perpendicular to a surface of a substrate. Both types of accelerometer structures can measure at least two distinct capacitances to determine differential or relative capacitance.

Prior art multiple axis acceleration transducers typically have monolithic designs. In a monolithic design, the sensing structures are fabricated on the same substrate, or device wafer, in a planar fashion. Although die size reduction may be achieved by more efficient die area design processes, more aggressive fabrication processes, and so forth, there is a limit to the effectiveness of these processes without increasing manufacturing cost or sacrificing part performance.

Accordingly, there is a need for an improved MEMS acceleration transducer and fabrication methodology for overcoming the problems in the art as discussed above.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In accordance with the teachings herein, a compact acceleration transducer or accelerometer, is provided as an example for illustrative purposes. Embodiments of the acceleration transducer may include sensing along one, two, or three axes. Multiple axis sensing can be adapted to detect acceleration in two orthogonal axes that are parallel to a planar surface of the transducer, as well as to detect acceleration in an axis that is perpendicular to the planar surface of the transducer. In addition, the acceleration transducer may be adapted to detect acceleration at different acceleration sensing ranges, i.e., g levels. An embodiment of the invention further includes fabrication methodology for a vertically integrated, or stacked, acceleration transducer. Such an acceleration transducer is formed by separately fabricating two transducer wafers and subsequently bonding the two transducer wafers to create an acceleration transducer capable of sensing along the one, two, or three axes at the same or at different acceleration sensing ranges.

Figure 1:
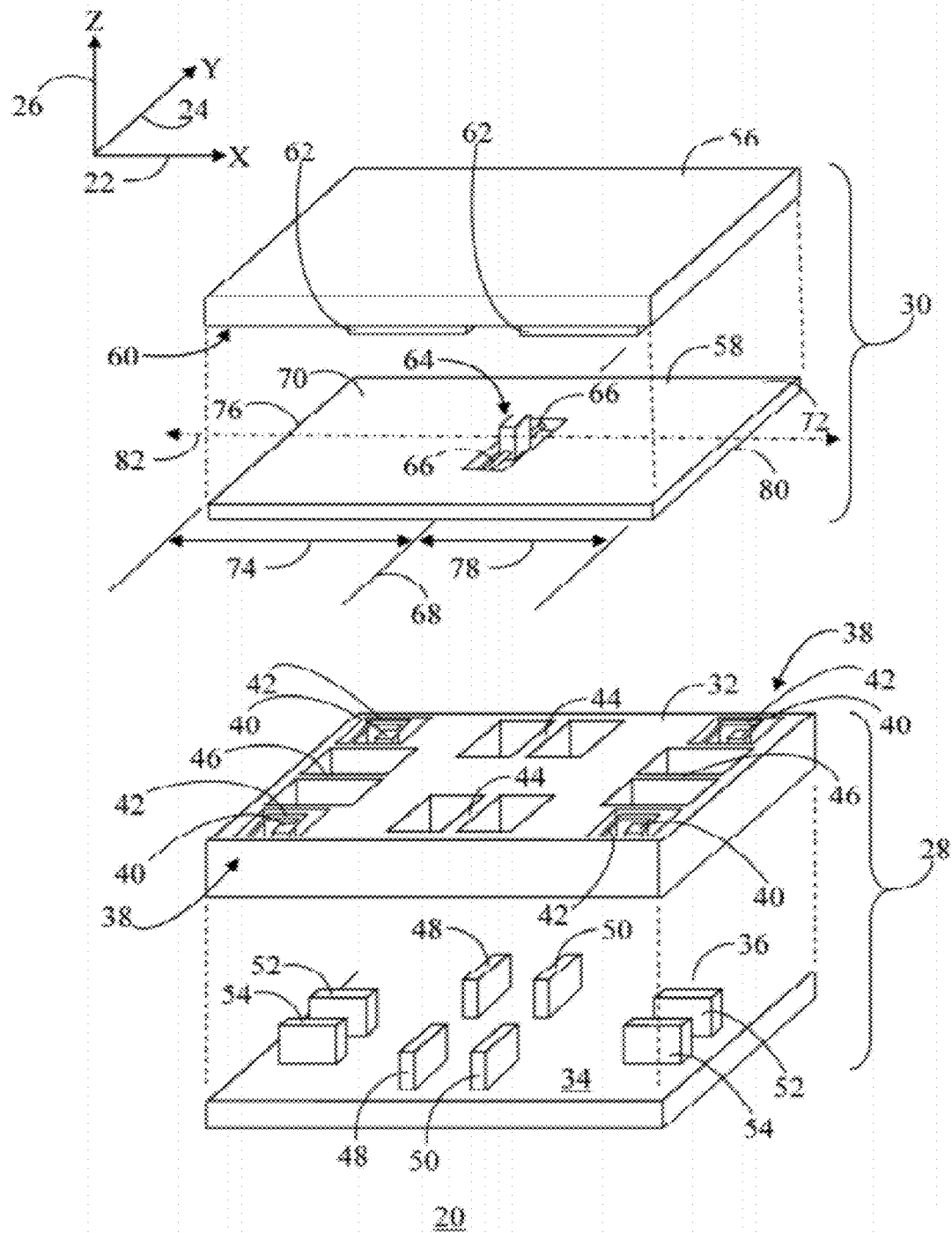
FIG. 1 shows an exploded perspective view of a microelectromechanical systems (MEMS) acceleration transducer in accordance with an embodiment of the invention.

FIG. 1 shows an exploded perspective view of a microelectromechanical systems (MEMS) acceleration transducer 20 in accordance with an embodiment of the invention. In the illustrated embodiment, transducer 20 is a multiple axis capacitive-sensing accelerometer adapted to sense acceleration in three mutually orthogonal directions. More specifically, transducer 20 senses acceleration in a direction 22 corresponding to an X axis, a direction 24 corresponding to a Y axis, and a direction 26 corresponding to a Z axis. For clarity, direction 22 is referred to hereinafter as X-direction 22, direction 24 is referred to as Y-direction 24, and direction 26 is referred to as Z-direction 26. Although transducer 20 is described herein as sensing acceleration in three mutually orthogonal directions, it should be understood that transducer 20 may be adapted to sense acceleration in only one direction or in two mutually orthogonal directions, as will be discussed in greater detail below. The layers of transducer 20 are shown as being separate for ease of view. However, it should be understood that the layers of transducer would actually be fitted together when implemented.

In an embodiment, transducer 20 includes a dual axis sensor 28 and a single axis sensor 30. Dual axis sensor 28 may be adapted to sense acceleration in X-direction 22 and Y-direction 24, and single axis sensor 30 may be adapted to sense acceleration in Z-direction 26. Sensors 28 and 30 are fabricated separately, then they are bonded together to create MEMS transducer 20 with sensor 30 located above sensor 28. This separate, or independent, fabrication strategy enables the utilization of different transducer manufacturing technologies for the two sensors 28 and 30 so as to achieve the most advantageous manufacturing solutions for particular transducer applications.

Dual axis sensor 28 includes a proof mass 32 spaced apart from, i.e., suspended above and positioned in spaced apart relationship above, a surface 34 of a substrate 36 via an anchor system 38. Anchor system 38 movably couples proof mass 32 to substrate 36. In an embodiment, anchor system 38 includes a number of anchors 40 formed on or coupled to surface 34 of substrate 36. Proof mass 32 is attached to anchors 40 by springs 42 that are preferably compliant in two mutually orthogonal directions, i.e., X-direction 22 and Y-direction 24. Thus, anchor system 38 enables proof mass 32 to move substantially parallel to surface 34 of substrate 36 in response to acceleration in either of X- and Y-directions 22 and 24, respectively.

Proof mass 32 of sensor 28 includes a first set of movable electrodes, referred to herein as movable fingers 44, and a second set of movable electrodes, referred to herein as movable fingers 46. Each movable finger 44 is surrounded by a pair of fixed electrodes, referred to herein as fixed fingers 48 and 50 that are formed on, or otherwise attached to, surface 34 of substrate 36. Fixed fingers 48 and 50 are in non-movable connection with substrate 36. That is, fixed fingers 48 and 50 do not move separate from substrate 36. Fingers 44, 48, and 50 are arranged perpendicular to X-direction 22 and form a differential capacitive structure for determining acceleration in X-direction 22. Likewise, each movable finger 46 is surrounded by a pair of fixed electrodes, referred to herein as fixed fingers 52 and 54 formed on, or otherwise attached to, surface 34 of substrate 36 so that they are in non-movable connection with substrate 36. Fingers 46, 52 and 54 are arranged perpendicular to Y-direction 24 and form a differential capacitive structure for determining acceleration in Y-direction 24.

When dual axis sensor 28 experiences acceleration in X-direction 22, proof mass 32 moves in X-direction 22 so that the distance between movable fingers 44 and the adjacent fixed fingers 48 and 50 changes, thus changing the capacitance between these fingers. This change in capacitance is registered by the sense circuitry (not shown) and converted to an output signal representative of the acceleration in X-direction 22. Acceleration in Y-direction 24 is sensed in an analogous manner by registering the change in capacitance between movable fingers 46 and the corresponding fixed fingers 52 and 54 when proof mass 32 moves in Y-direction 24. Accordingly, sensor 28 detects acceleration in orthogonal directions that are substantially parallel to surface 34 of substrate 36, namely X-direction 22 and Y-direction 24.

Various structures of sensor 38, such as proof mass 32, movable fingers 44 and 46, fixed fingers 48, 50, 52, and 54, springs 42, and anchors 40 are provided for illustrative purposes. It should be understood by those skilled in the art that these various elements can take different forms in accordance with particular design constraints. For example, proof mass 32 can have a different shape and there can be varying quantities and arrangements of movable fingers 44 and 46 and fixed fingers 48, 50, 52, and 54. In this exemplary embodiment, there are a total of four anchors 40 and four springs 42, with one spring 42 interconnecting each anchor 40 with proof mass 32. However, the quantity and location of anchors 40 and/or springs 42 can vary.

Single axis sensor 30 includes a substrate 56 and a proof mass 58 movably coupled to and spaced apart from a surface 60 of substrate 56. Substrate 56 has a number of conductive electrode elements 62 of a predetermined configuration deposited on surface 60 to form capacitor electrode elements or "plates." In an exemplary scenario, electrode elements 62 may operate as excitation or sensing electrodes to receive stimulating signals. Electrode elements 62 may additionally operate as a feedback electrodes when a feedback signal is superimposed on the sensing signal. In alternative embodiments, separate sensing and excitation electrodes may be formed on surface 60 of substrate 56 in accordance with known configurations.

Proof mass 58 is rotationally suspended from substrate 56 by an anchor system 64 formed on, or otherwise attached to surface 60 of substrate 56. For example, proof mass 58 is flexibly suspended above surface 60 of substrate 56 by rotational flexures 66 of anchor system 64 that enable proof mass 58 to pivot or rotate about a rotational axis 68. When intended for operation as a teeter-totter type accelerometer, a section 70 of proof mass 58 on one side of rotational axis 68 is formed with relatively greater mass than a section 72 of proof mass 58 on the other side of rotational axis 68. The greater mass of section 70 is typically created by offsetting rotational axis 68. That is, a length 74 between rotational axis 68 and an end 76 of section 70 is greater than a length 78 between rotational axis 68 and an end 80 of section 72. In addition, electrode elements 62 are sized and spaced symmetrically with respect to rotational axis 68 and a longitudinal axis 82 of proof mass 58.

In alternative embodiments, rotational axis 68 may be centered between ends 76 and 80 of proof mass 58. In such a configuration, the differing mass between section 70 and section 72 may be accomplished by making apertures through proof mass 58 in, for example, section 72 to decrease its mass relative to section 70. Alternatively, additional mass may be added to proof mass 58 on, for example, section 70 to increase its mass relative to section 72.

Due to the difference in mass between sections 70 and 72, proof mass 58 pivots about rotational axis 68 in response to acceleration in Z-direction 26, thus changing its position relative to the fixed electrode elements 62. This change in position results in a set of capacitors whose difference, i.e., a differential capacitance, is indicative of acceleration in Z-direction 26 perpendicular to surface 60 of substrate 56.

As will be discussed in greater detail below, substrate 56 is mechanically coupled to substrate 36 such that surface 60 faces surface 34, and proof mass 58 is situated facing proof mass 32. The mechanical coupling of substrate 56 with substrate 36 forms a chamber in which both proof mass 32 and proof mass 58 are located. In an embodiment, this mechanical coupling yields a chamber that is hermetically sealed. Thus, a multiple axis vertically integrated, or stacked, acceleration transducer is formed. The stacked configuration of transducer 20 formed from two sensors 28 and 30 can reduce transducer die size relative to prior art monolithic devices, yields a more attractive form factor, and can preclude the need for a separate cap wafer typically utilized to hermetically seal the components of a MEMS device.

MEMS sensor applications are calling for lower temperature coefficient of offset (TCO) specifications. The term "offset" refers to the output deviation from its nominal value at the non-excited state of the MEMS sensor. Thus, TCO is a measure of how much thermal stresses effect the performance of a semiconductor device, such as a MEMS device. The packaging of MEMS device applications often uses materials with dissimilar coefficients of thermal expansion. Thus, an undesirably high TCO can develop during manufacture or operation. These thermal stresses, as well as stresses due to moisture and assembly processes, can result in deformation of the underlying substrate, referred to herein as package stress, making the MEMS sensor more prone to measurement inaccuracies. Proof masses 32 and 58 are geometrically centered relative to one another. The geometrically centered arrangement of proof masses 32 and 58 of sensors 28 and 30 can reduce unwanted thermally induced offset, thereby resulting in better TCO performance.

Figure 2:
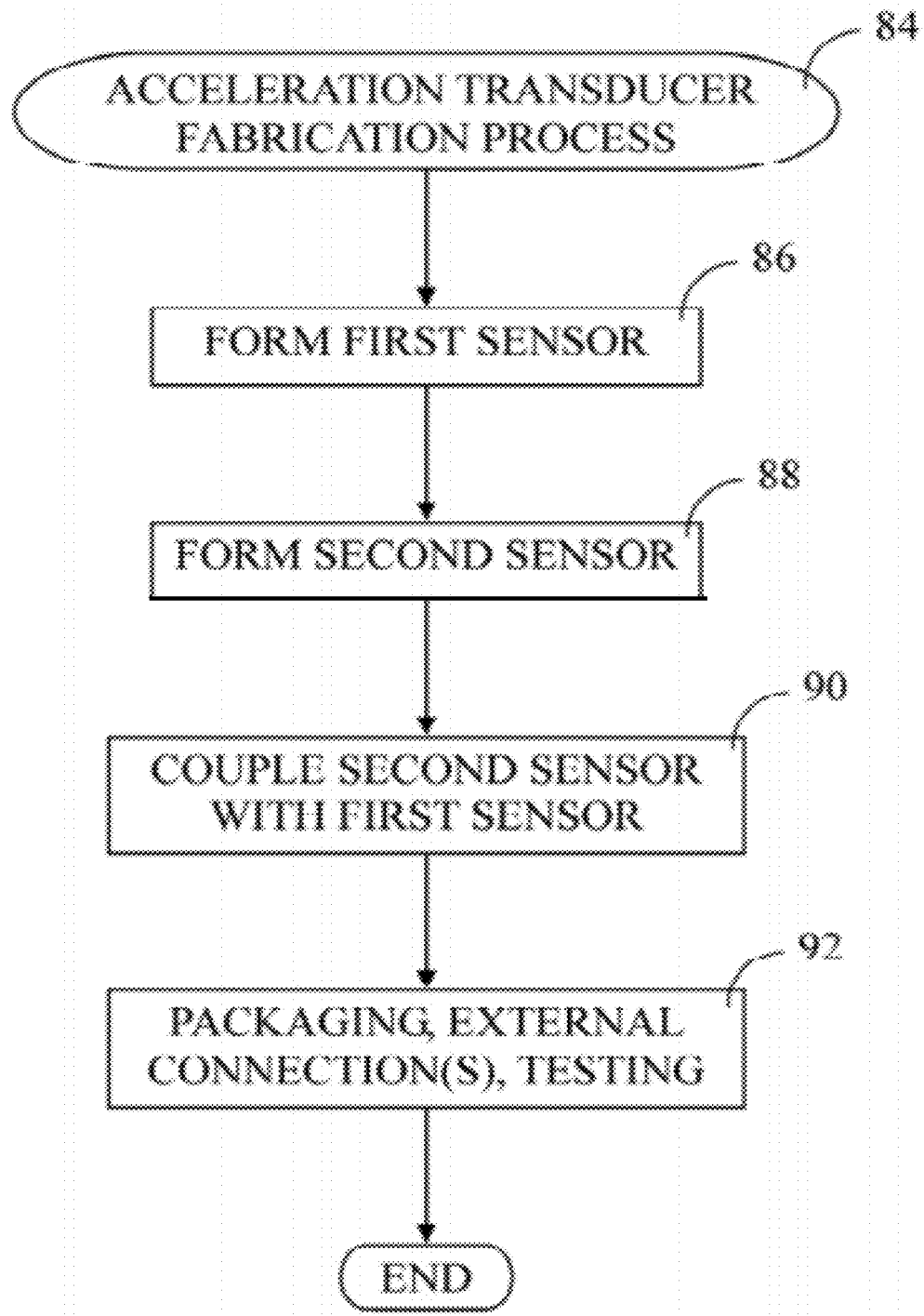
FIG. 2 shows a flowchart of a fabrication process for producing the acceleration transducer of FIG. 1 according to an exemplary embodiment.

FIG. 2 shows a flowchart of an acceleration transducer fabrication process 84 for producing acceleration transducer 20 according to an exemplary embodiment. Process 84 generally describes methodology for forming the separate sensors 28 and 30 and their subsequent bonding to form acceleration transducer 20. The separate formation of sensors 28 and 30 enables the utilization of different transducer manufacturing technologies for the two sensors 28 and 30 so as to achieve the most advantageous manufacturing solutions for particular transducer applications. In addition, MEMS devices typically require a cavity package with a lid. Fabrication process 84 describes a packaging technique in which sensor 30 is stacked with sensor 28 thereby eliminating the need for a separate cap wafer to hermetically seal the components of acceleration transducer 20. Fabrication process 84 is described below in connection with the fabrication of a single acceleration transducer 20. However, it should be understood by those skilled in the art that the following process allows for concurrent wafer-level manufacturing of a plurality of transducers 20. The individual transducers 20 can then be cut, or diced, in a conventional manner to provide individual acceleration transducers that are hermetically packaged.

Acceleration transducer fabrication process 84 includes a task 86 at which dual axis sensor 28 (FIG. 1) is formed. The formation of dual axis sensor 28 may include various patterning, deposition, and etching operations to form proof mass 32, anchor system 38, fixed fingers 48, 50, 52, 54, and the like. For example, the fabrication of movable parts, such as proof mass 32, can entail the implementation of release layers, also known as sacrificial layers. That is, a movable part can be built by depositing a sacrificial layer (not shown), which is selectively removed at the locations where the future beams, e.g., anchor system 38, will be attached to the underlying substrate. A structural layer is then deposited on top of the sacrificial layer and structured. The sacrificial layer is subsequently removed to release the movable parts, using a selective etch process that will not change the structural layer. In an embodiment, dual axis sensor 28 may be formed utilizing high aspect ratio micromachining processes to produce relatively tall microstructures with stiff, vertical sidewalls, i.e., a relatively thick proof mass 32. High aspect ratio micromachining processes can be utilized to form three-dimensional structures, having an aspect ratio greater than, for example, 5:1.

Acceleration transducer fabrication process 84 further includes a task 88 at which single axis sensor 30 is formed. The formation of single axis sensor 30 may include various patterning, deposition, and etching operations of sacrificial and structural layers to form proof mass 58 suspended above and positioned in spaced apart relationship above surface 60 of substrate 56, and to form electrode elements 62 and anchor system 64. In an embodiment, single axis sensor 30 may be formed utilizing surface micromachining processes. Surface micromachining enables patterning of thin films of polysilicon and other materials to form essentially two-dimensional planar structures, since the thickness of the structures is limited by the thickness of the deposited films.

It should be noted that task 86 pertains to the fabrication of dual axis sensor 28 and task 88 pertains to the fabrication of single axis sensor 30. Accordingly, although they are described herein as being serial operations for simplicity, these distinct operations may be performed in parallel in separate areas of a single manufacturing facility or these distinct operations may be performed at different manufacturing facilities.

It should be further noted that acceleration transducer fabrication process 84 is described in connection with formation of dual axis sensor 28 and single axis sensor 30 in an embodiment. However, in alternative embodiments, sensors 28 and 30 may be any combination of single or dual axis sensors in accordance with particular design requirements. For example, sensor 28 may be adapted to sense in one of X-direction 22, Y-direction 24, or Z-direction 26. Similarly, sensor 30 may be adapted to sense in one of X-direction 22, Y-direction 24, or Z-direction 26. Accordingly, acceleration transducer 20 may sense acceleration in only X-direction 22, Y-direction 24, or Z-direction 26 or any combination of X-, Y-, and Z-directions, 22, 24, 26.

The independent fabrication methodology of sensors 28 and 30 further enables the formation of sensors 28 and 30 that detect acceleration in different sensing ranges within a single acceleration transducer package in accordance with particular design requirements. For example, sensor 28 may be utilized to detect acceleration in a medium-g sensing range of, for example, ten to one hundred g's. Sensor 30 may detect acceleration in the same sensing direction or directions as sensor 28 but may be utilized to detect acceleration in a different sensing range, for example, a high-g sensing range of greater than one hundred g's or a low-g sensing range of less than ten g's. Accordingly, sensor formation tasks 86 and 88 utilizing the same or differing fabrication processes enable configuration of an optimal transducer design for a desired application.

Following tasks 86 and 88, acceleration transducer fabrication process 84 continues with a task 90. At task 90, sensor 30 is mechanically coupled with sensor 28 using conventional wafer bonding processes to form acceleration transducer 20. Coupling of sensors 28 and 30 may be achieved through application of bonding layers on bonding perimeters of each of corresponding substrates 36 and 56. Such bonding layers may be metallic bond rings that couple to one another to form a hermetically sealed joint surrounding proof masses 32 and 58. The bonding layers can be a number of different materials typically used for creating the hermetically sealed joint. Such materials include, for example, aluminum, copper, silver, gold, indium, alloys thereof, compounds thereof, glass frit, and the like. It should be understood, however, that if a hermetic seal is not desired, the bonding layers may alternatively be formed from filled epoxies or filled silicones.

A task 92 may be performed subsequent to coupling task 90. At task 92, acceleration transducer 20 may undergo further operations in accordance with conventional processes, such as wafer thinning, packaging, wirebonding to form external connections, testing and so forth. Following task 92, acceleration transducer fabrication process 84 ends and acceleration transducer 20 may be utilized for acceleration measurement.

Figure 3:
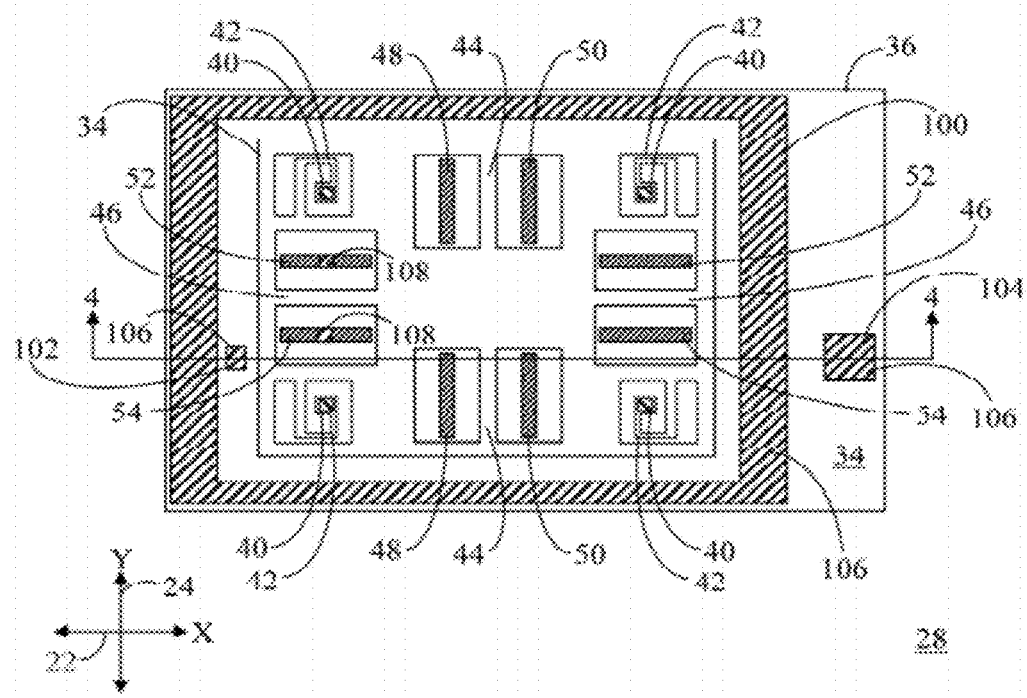
FIG. 3 shows a top view of a dual axis sensor of the acceleration transducer of FIG. 1.
Figure 4:
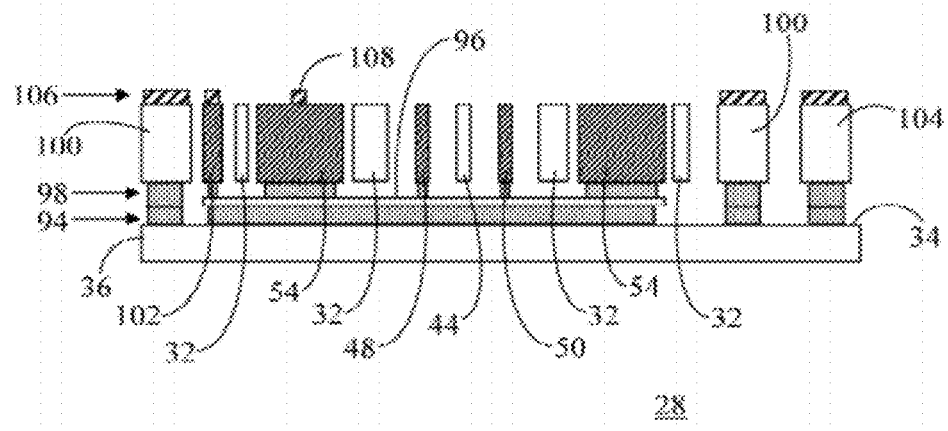
FIG. 4 shows a side view of the dual axis sensor along section lines 4-4 of FIG. 3.

Referring now to FIGS. 3-4, FIG. 3 shows a top view of dual axis sensor 28 of acceleration transducer 20 (FIG. 1), and FIG. 4 shows a side view of dual axis sensor 28 along section lines 4-4 of FIG. 3. Dual axis sensor 28 was formed through the execution of task 86 (FIG. 2) of acceleration transducer fabrication process 84 (FIG. 2) using, for example, known and developing high aspect ratio micromachining processes.

In an embodiment, sensor 28 includes an isolation layer 94 overlying surface 34 of substrate 36. Patterning, etching, and/or deposition processes may then be performed to form an electrically conductive layer 96 overlying isolation layer 94, and another isolation layer 98 may be formed over conductive layer 96. Electrically conductive layer 96 may be formed and patterned to provide the appropriate electrical connections between fixed fingers 48, 50, 52, and 54 as needed. Proof mass 32, fixed finger 48, 50, 52, and 54, anchors 40, and springs 42 are subsequently formed over isolation layer 98. Selective sacrificial layer deposition and etching results in the release of proof mass 32 from surface 34 of substrate 36 to enable its movement substantially parallel to surface 34 in response to acceleration sensed in X-direction 22 and/or Y-direction 24.

Sensor 28 may further include a seal ring 100, one or more internal connection sites 102 (of which only one is shown for simplicity), and one or more external connection sites 104 (of which only one is shown for simplicity) that are formed concurrently with other components of sensor 28. Seal ring 100 encircles proof mass 32 and defines the location at which sensor 28 will be coupled with sensor 30 (FIG. 1). Internal connection sites 102 are implemented to form electrical connections between sensor 28 and sensor 30, as needed. External connection sites 104 are implemented to form electrical connections between sensor 28 and sensor 30 and/or between sensor 28 and external circuitry (not shown), as needed.

Prior to removal of an underlying sacrificial layer (not shown) and release of proof mass 32, a top layer 106 may be deposited over the underlying structures. Top layer 106 may be patterned and etched so that top layer 106 remains on seal ring 100 to serve as a bonding medium for creating a hermetically sealed joint between sensor 28 and sensor 30 (FIG. 1). In an embodiment, top layer 106 may be an electrically conductive material such as aluminum, copper, silver, gold, indium, alloys thereof, and compounds thereof. Thus, top layer 106 may also be appropriately patterned and etched so that it remains on internal connection sites 102 and external connection sites 104 in order to form subsequent electrical connections, discussed below.

In accordance with an embodiment of the invention, top layer 106 may additionally be appropriately patterned and etched so that it remains on at least a portion of the underlying fixed structure of sensor 28 to form one or more over-travel stops 108 (of which two are shown for simplicity). As illustrated, over-travel stops 108 are formed on and extend above one pair of fixed fingers 52 and 54. Thus, over-travel stops 108 are in non-movable connection with surface 34 of substrate 36 via fixed fingers 52 and 54. Once sensors 28 and 30 are coupled, over-travel stops 108 function to limit movement of proof mass 58 (FIG. 1) so that proof mass 58 cannot come into contact with proof mass 32 when sensor 30 is subjected to harsh acceleration in Z-direction 26 (FIG. 1).

Figure 5:
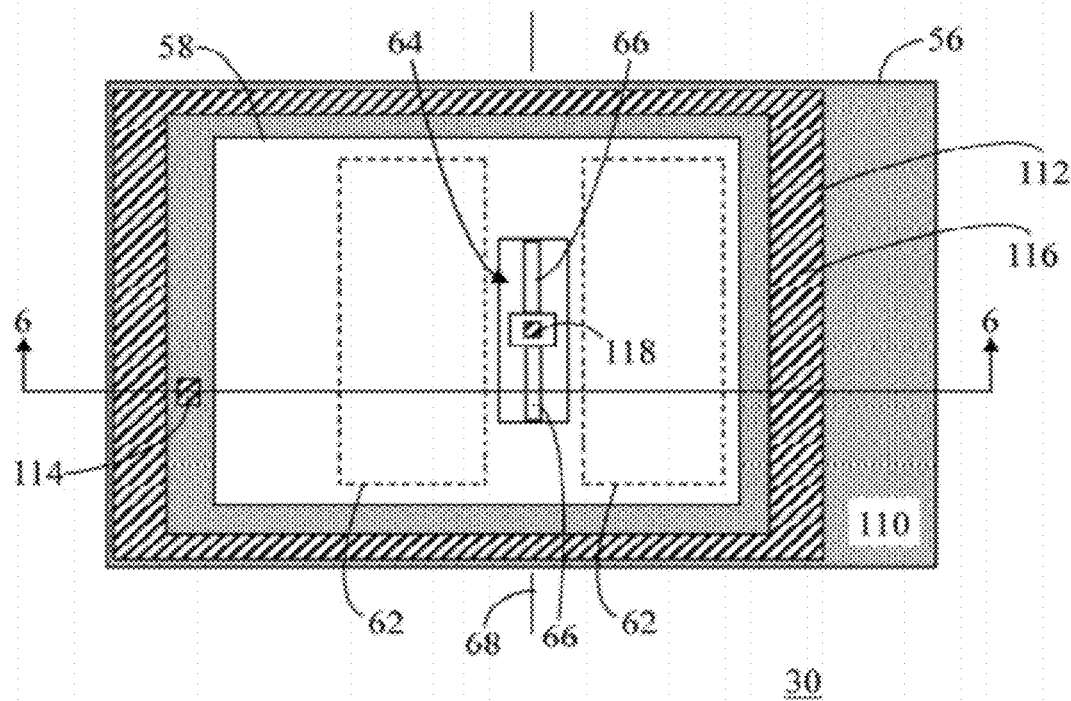
FIG. 5 shows a top view of a single axis sensor of the acceleration transducer of FIG. 1.
Figure 6:
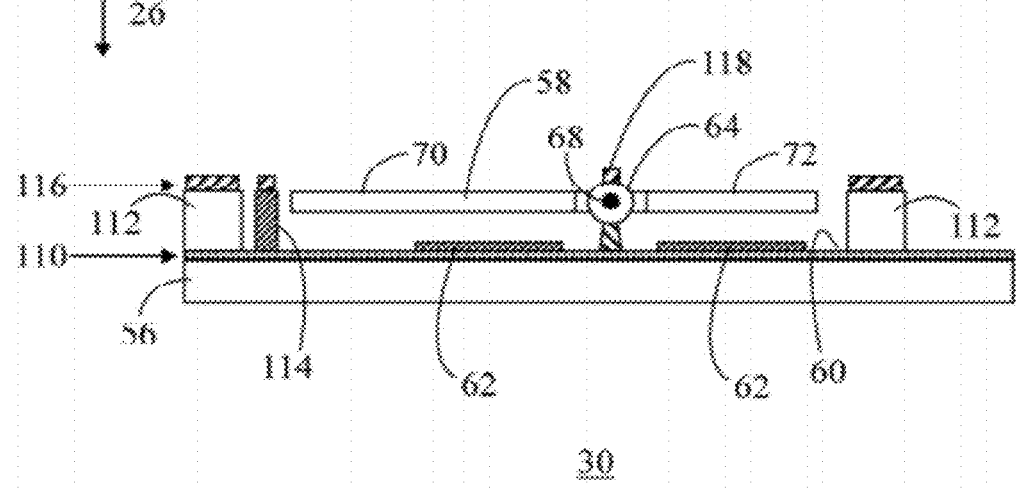
FIG. 6 shows a side view of the single axis sensor along section lines 6-6 of FIG. 5.

Referring now to FIGS. 5-6, FIG. 5 shows a top view of single axis sensor 30 of acceleration transducer 20 (FIG. 1), and FIG. 6 shows a side view of single axis sensor 30 along section lines 6-6 of FIG. 4. Single axis sensor 30 was formed through the execution of task 88 (FIG. 2) of acceleration transducer fabrication process 84 (FIG. 2) using, for example, known and developing surface micromachining processes.

In an embodiment, sensor 30 includes an isolation layer 110 overlying surface 60 of substrate 56. Patterning, etching, and/or deposition processes may then be performed to form electrode elements 62 overlying isolation layer 110. Proof mass 58 and anchor system 64 are subsequently formed over isolation layer 110. Selective sacrificial layer deposition and etching results in the release of proof mass 58 from surface 60 of substrate 56 to enable its pivotal movement about rotational axis 68 in response to acceleration sensed in Z-direction 26.

Sensor 30 may further include a seal ring 112 and, if needed, one or more internal connection sites 114 (of which only one is shown for simplicity), and, if needed, one or more external connection sites (not shown) that are formed concurrently with other components of sensor 30. Seal ring 112 encircles proof mass 58 and defines the location at which sensor 30 will be coupled with sensor 28 (FIG. 3). Internal connection sites 114 may be implemented to form electrical connections between sensor 28 and sensor 30, as needed. The external connection sites, if present, may be implemented to form electrical connections between sensor 28 and sensor 30 and/or between sensor 30 and external circuitry (not shown), as needed.

Prior to removal of an underlying sacrificial layer (not shown) and release of proof mass 58, a top layer 116 may be deposited over the underlying structures. Top layer 116 may be patterned and etched so that top layer 116 remains on seal ring 112 to serve as a bonding medium for creating a hermetically sealed joint between sensor 28 (FIG. 3) and sensor 30. Like top layer 106 (FIG. 3), top layer 116 may be an electrically conductive material such as aluminum, copper, silver, gold, indium, alloys thereof, and compounds thereof. Thus, top layer 116 may also be appropriately patterned and etched so that it remains on internal connection sites 114 and the external connection sites (if present) in order to form subsequent electrical connections, discussed below.

In accordance with an embodiment of the invention, top layer 116 may additionally be appropriately patterned and etched so that it remains on at least a portion of the underlying fixed structure of sensor 30 to form one or more over-travel stops 118 (of which only one is shown for simplicity). As illustrated, over-travel stop 118 is formed on and extends above a fixed portion of anchor system 64. Thus, over-travel stop 118 is in non-movable connection with surface 60 of substrate 56 via anchor system 64. Once sensors 28 and 30 are coupled, over-travel stop 118 functions to limit movement of proof mass 32 (FIG. 3) so that proof mass 32 cannot come into contact with proof mass 58 when sensor 28 is subjected to harsh acceleration in Z-direction 26. That is, proof mass 32 is designed to move in X-direction 22 (FIG. 1) and/or Y-direction 24 (FIG. 1) when subjected to acceleration in either of those directions. However, the compliance of anchor system 38 (FIG. 1) may enable proof mass 32 to experience some movement in Z-direction 26 under excessive accelerations. Accordingly, over-travel stop 118 limits this undesired movement.

Figure 7:
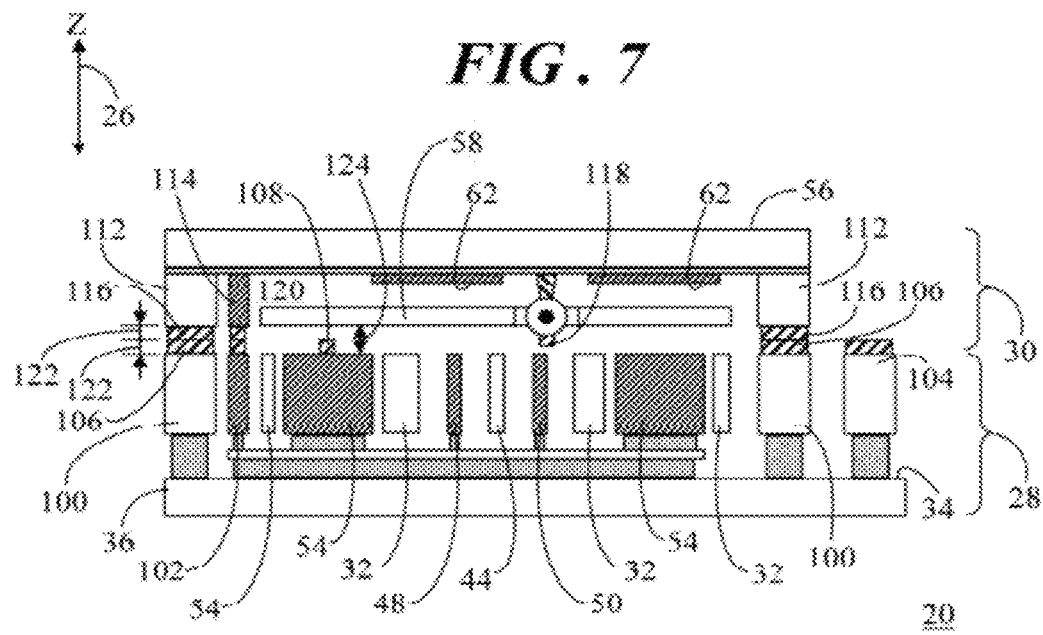
FIG. 7 shows a side view of the dual axis sensor coupled with the single axis sensor of to form the acceleration transducer of FIG. 1.

FIG. 7 shows a side view of dual axis sensor 28 coupled with the single axis sensor 30 to form acceleration transducer 20. Top layer 116 on seal ring 112 of sensor 30 is bonded with top layer 106 on seal ring 100 of sensor 28 to form an interior volume, or chamber 120, in which the functional components of each of sensors 28 and 30 are located. In addition, a portion of substrate 56 was sawn to reveal external connection sites 104.

In an embodiment, top layers 106 and 116 may be formed from aluminum and bonding may occur using a thermocompression bonding technique, although this bonding technique is not a limitation. Thermocompression bonding involves heating sensors 28 and/or 30 to approximately four hundred and fifty degrees Celsius and then pressing top layer 116 on seal ring 112 of sensor 30 to the corresponding top layer 106 on seal ring 100 of sensor 28 with a predetermined pressure (e.g., from 200 to 400 lb/sq inch). A hermetically sealed bond with excellent physical and electrical properties is subsequently formed. Per convention, an additional operation of oxide break-down by, for example, an ultrasonic scrub, wet etch, or plasma clean may be required prior to bonding.

The height of each of seal rings 100 and 112 is commensurate with the height of the structural components of their corresponding sensors 28 and 30. Accordingly, an appropriate thickness 122 of each of top layers 106 and 116 produces a clearance, or gap 124, between proof mass 58 of sensor 30 and proof mass 32 and fixed fingers 48, 50, 52, and 54 of sensor 28. Gap 124 is configured to be wide enough to minimize cross-talk capacitance between sensor 30 and sensor 28. In an exemplary configuration, thickness 122 of each of top layers 106 and 116 may be approximately four micrometers to yield a width of gap 124 of approximately eight micrometers in order to minimize cross-talk capacitance. Implementation of an aluminum-to-aluminum thermocompression bonding technique provides for excellent accuracy in controlling the width of gap 124.

Over-travel stops 108 and 118 are located within chamber 120 between proof mass 32 and proof mass 58. Over-travel stops 108 limit the movement of proof mass 58 in Z-direction 26. Likewise, over-travel stop 118 limits movement of proof mass 32 in Z-direction 26. Thus, since thickness 122 of each top layers 106 and 116 is approximately four micrometers in the exemplary configuration, and corresponding over-travel stops 108 and 118 are formed in conjunction with top layers 106 and 116, over-travel stops 108 and 118 are also approximately four micrometers thick. As such, over-travel stops 108 and 118 limit movement in Z-direction 26 to four micrometers of maximum travel.

Figure 8:
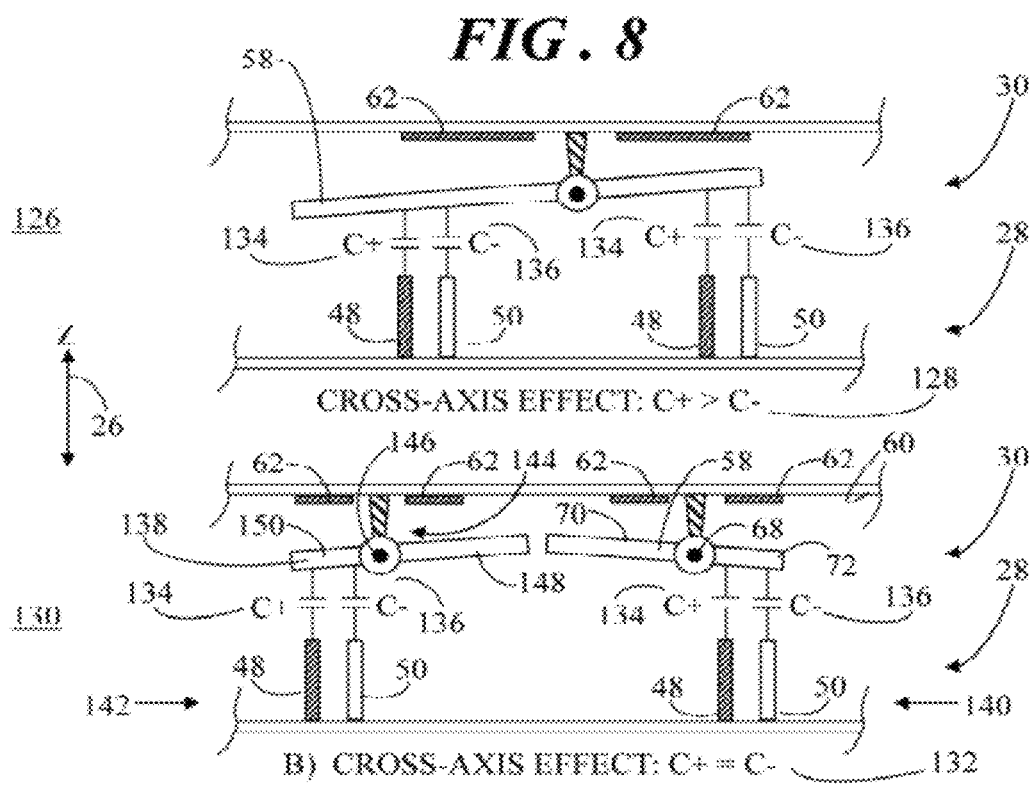
FIG. 8 shows a first illustration demonstrating a cross-talk capacitance effect and a second illustration demonstrating cross-talk capacitance cancellation in accordance with an embodiment of the invention.

FIG. 8 shows a first illustration 126 demonstrating a cross-talk capacitance effect 128 and a second illustration 130 demonstrating cross-talk capacitance cancellation 132 in accordance with an embodiment of the invention. As discussed previously, the movement of a proof mass toward sense electrodes changes a capacitance between the proof mass and the sense electrodes. More particularly, the capacitance increases as the proof mass moves closer to the sense electrodes. As shown in illustration 126, in a scenario in which sensor 28 includes multiple fixed fingers 48 and 50, a first capacitance 134, labeled C+, between fixed fingers 48 and proof mass 58 of sensor 30 may be greater than a second capacitance 136, labeled C−, between fixed fingers 50 and proof mass 58 of sensor 30. The capacitance imbalance between capacitance 134, labeled C+, and capacitance 136, labeled C−, represents cross-talk capacitance effect 128. This can cause measurement inaccuracies in sensor 28.

In order to reduce the measurement inaccuracies in sensor 28 caused by cross-talk capacitance effect 128, in an alternative embodiment, sensor 30 may include an additional proof mass 138. This configuration is shown in second illustration 130. By way of example, proof mass 58 is in opposing relationship with a portion 140, or subset, of fixed fingers 48 and 50. Proof mass 138 is spaced apart from surface 60 of substrate 56, and is in opposing relationship with another portion 142, or subset, of fixed fingers 48 and 50. An anchor system 144 is formed on surface 60 of substrate 56 and is pivotally coupled with proof mass 138 at another rotational axis 146. Anchor system 144 enables proof mass 138 to rotate about rotational axis 146 in response to acceleration in Z-direction 26.

It should be noted that rotational axis 146 is offset from a midline of proof mass 138. This results in a section 148 of proof mass 138 being formed with a relatively greater mass than a section 150 of proof mass 138. Moreover, the offset of rotational axis 146 is generally equal to and in a direction opposite that of the offset of rotational axis 68 from a midline of proof mass 58. Accordingly, the mass of section 148 of proof mass 138 is substantially equal to the mass of section 70 of proof mass 58. Likewise the mass of section 150 of proof mass 138 is substantially equal to the mass of section 72 of proof mass 58. Accordingly, acceleration in Z-direction 26 will cause proof masses 58 and 138 to pivot about their corresponding axes 68 and 146 in equal but opposite directions.

In this configuration, the summation of first capacitances 134, labeled C+, between fixed fingers 48 and proof masses 58 and 138 is approximately equal to the summation of second capacitances 136, labeled C−, between fixed fingers 50 and proof masses 58 and 138. Accordingly, in the configuration of second illustration 130, the cross-talk capacitance is balanced, i.e., C+=C−, thus yielding cross-talk capacitance cancellation 132.

Figure 9:
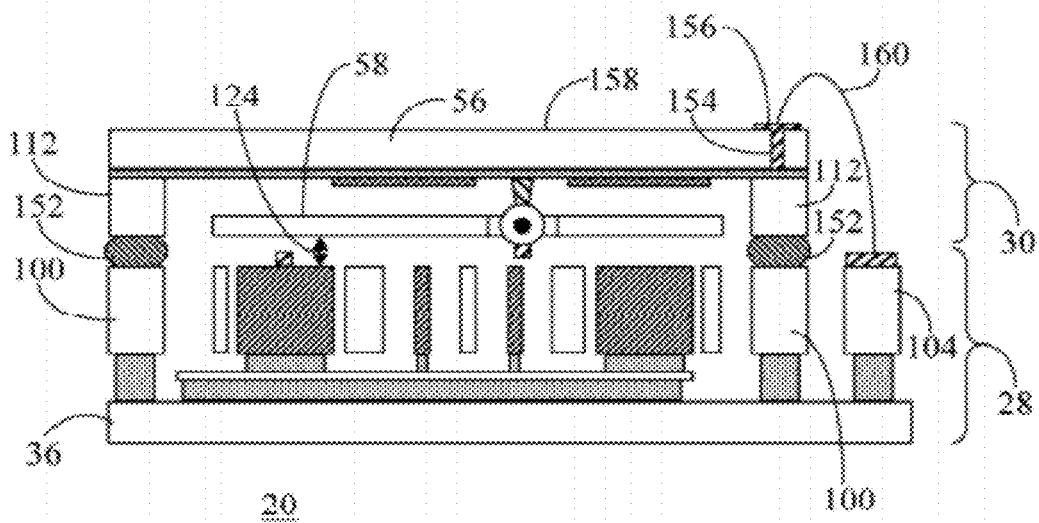
FIG. 9 shows a side view of the transducer of FIG. 1 in accordance with an alternative embodiment.

FIG. 9 shows a side view of transducer 20 following packaging in accordance with an alternative embodiment. Although, aluminum-to-aluminum thermocompression bonding (discussed above) is a preferred bonding technique due to its excellent accuracy in control of the width of gap 124, other bonding techniques may be employed. Other bonding techniques include, but are not limited to, eutectic bonding, silicon fusion bonding, glass frit bonding, and so forth. In this exemplary illustration, a bond 152 is formed between seal rings 100 and 112 of sensors 28 and 30 using a glass frit bonding technique. Glass frit bonding enables the bonding of surface materials commonly used in MEMS technology and can be used for wafer level encapsulation and packaging. It allows for hermetic sealing and a high process yield.

In this embodiment, for non-conductive glass frit bonding, electrical connection between sensor 28 and sensor 30 can be achieved by wirebonding. For example, transducer 20 further includes at least one through-silicon via 154 extending through substrate 56 of sensor 30 and having a contact 156 on an outer surface 158 of substrate 56. A wirebond 160 is formed between contact 156 and external connection site 104.

Figure 10:
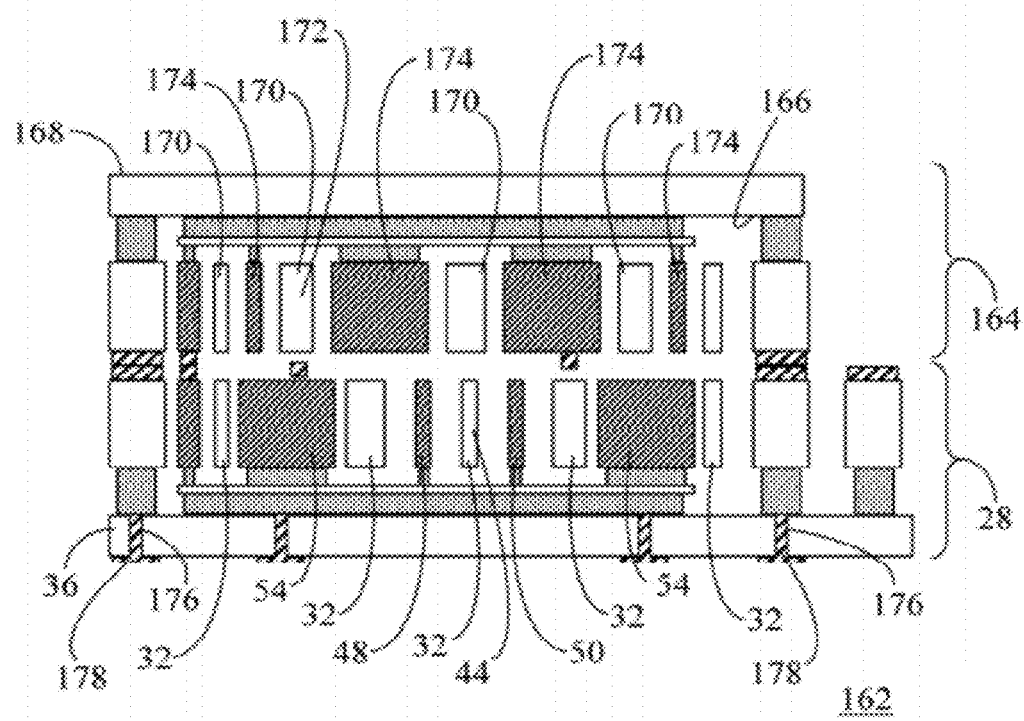
FIG. 10 shows a side view of a MEMS acceleration transducer in accordance with another alternative embodiment.

FIG. 10 shows a side view of a MEMS acceleration transducer 162 in accordance with another alternative embodiment. As mentioned previously, embodiments of the acceleration transducer may include sensing along one, two, or three axes. Multiple axis sensing can be adapted to detect movement in two orthogonal axes that are parallel to a planar surface of the transducer. In addition, the acceleration transducer may be adapted to detect movement at different acceleration sensing ranges, i.e., g levels.

In the illustrated embodiment, transducer 162 is a multiple axis capacitive-sensing accelerometer adapted to sense acceleration in two mutually orthogonal directions and at different acceleration sensing ranges. Transducer 162 includes sensor 28 and another sensor 164 coupled with sensor 28 in accordance with methodology described above. In this embodiment, sensor 28 senses acceleration in X-direction 22 (FIG. 1) and Y-direction 24 (FIG. 1). Likewise, sensor 164 senses acceleration in X-direction 22 (FIG. 1) and Y-direction 24 (FIG. 1).

Sensor 164 can include structures similar to those discussed in connection with sensor 28. For example, sensor 164 includes an anchor system, such as anchor system 38 (shown in FIG. 1) formed on a surface 166 of a substrate 168. The anchor system (e.g., anchor system 38) is coupled with a proof mass 170 having movable fingers, collectively referred to as movable fingers 172. Fixed fingers, collectively referred to as fixed fingers 174, are in non-movable connection with surface 166 of substrate 169, and each of movable fingers 172 is disposed between a pair of fixed fingers 174 to form a differential capacitive structure. Accordingly, the anchor system (e.g., anchor system 38) enables proof mass 170 to move substantially parallel to surface 166 of substrate 168 in response to acceleration in X-direction 22 (FIG. 1) and/or Y-direction 24 (FIG. 1).

The configuration of sensor 164 is similar to that of sensor 28 and sensor 164 detects acceleration in the same sense directions, i.e. X-direction 22 and Y-direction 24 as that of sensor 28. However, sensor 164 is adapted to detect acceleration over a different sensing range than the sensing range for sensor 28. By way of example, sensor 28 may be a low-g acceleration sensor suitable for detection of acceleration in X-direction 22 and Y-direction 24 at low-g levels of, for example less than ten g's. Sensor 164 may be a medium-g acceleration sensor suitable for detection of acceleration at medium-g levels of, for example, between ten and one hundred g's. Thus, sensor 28 senses acceleration over a first sensing range (low-g) that differs from the second sensing range (medium-g) of sensor 164. Different sensing ranges may be achieved through the implementation of anchor systems with different spring compliance so that corresponding proof masses 32 and 170 move appropriately when subjected to particular g's. Those skilled in the art will recognize, however, that other structural features may be implemented in sensors 28 and 164 to achieve the desired sensing range.

Although low-g and medium-g accelerometers are mentioned herein, it should be further understood that in other embodiments a transducer package may include any combination of low-g, medium-g, and high-g accelerometers specified for a particular application. Moreover, although particular sensing ranges are mentioned herein, it should be understood that a variety of sensing ranges may be established. In addition, although acceleration sensing over different sensing ranges is discussed in connection with sensing in X-direction 22 and/or Y-direction 24, in alternative embodiments, a transducer may include two sensors, each of which sense acceleration in Z-direction 26 (FIG. 1) and each sensing over different sensing ranges.

In an embodiment, transducer 162 further includes through-silicon vias 176 to create a chip-scale package configuration for transducer 162. A chip-scale package is a type of surface mount integrated circuit packaging in which the total package size is typically no more than twenty percent greater than the size of the die within. A through-silicon via is a vertical electrical connection passing completely through a silicon wafer or die. In this configuration, chip-scale package transducer 162 includes a number of through-silicon vias 176 electrically coupled with external contacts 178 that can be used to create space saving vertically configured surface mount electrical connections. Those skilled in the art will recognize that electrical connection is not limited to those techniques discussed herein but may alternatively implement current and developing technologies including, but not limited to, pins or leads of various styles, flat contacts, a matrix of solder balls (ball grid arrays), terminations on the body of the component, and so forth.

The description presented above pertains to a vertically integrated acceleration transducer that may include sensing along one, two, or three orthogonal axes. For example, the acceleration transducer may include two sensors, one of which senses a first physical stimulus (e.g., acceleration along one axis) and the other of which senses a second physical stimulus (e.g., acceleration along another axis that is orthogonal to the first axis). However, as the uses for microelectromechanical (MEMS) sensors continue to grow and diversify, there is an increasing need for MEMS sensor products in which various sensors capable of sensing even more disparate physical stimuli are integrated into the same package. For example, a sensor capable of sensing disparate physical stimuli may be useful for augmenting navigation. Such a sensor could be capable of sensing any combination of pressure to determine altitude (e.g., altimeter), motion such as acceleration, velocity, position (e.g., inertial sensor), angular rate (e.g. gyroscope), and/or orientation (e.g., gyroscope or magnetometer).

Currently, this can be accomplished by adding multiple MEMS die on the leadframe in a package that is wire bonded to a die holding the signal conditioning circuitry on an application-specific integrated circuit (ASIC). Multiple MEMS die on a leadframe increases package costs significantly and limits form factor. Another technique is to co-locate MEMS sensors that sense disparate physical stimuli on the same die. This requires the MEMS sensors to be fabricated concurrently in the same processes. The different sensing capability of different sensors typically calls for different wafer fabrication processes. Accordingly, the performance of one or more of the sensors could be compromised by constraining them to the same wafer. Moreover, the development of new fabrication technologies to integrate the different sensors on the same wafer requires significant and costly development as well as lateral area on the wafer for both sensors.

The above teachings may be adapted to integrate various sensors capable of sensing a variety of physical stimuli into the same package. As such, in alternative embodiments, sensors may be any combination of vertically integrated sensors configured to sense different physical stimuli in accordance with particular sensor design requirements. For example, a MEMS sensor device in accordance with this alternative embodiment may include any combination of inertial sensors (e.g., linear and/or angular rate sensors), pressure sensors, magnetic field sensors, proximity sensors, and so forth.

Acceleration transducer fabrication process 84 (FIG. 2) may be performed to produce a MEMS sensor device having two or more sensors each of which are configured to sense a different physical stimulus. In an embodiment described below, a MEMS sensor device includes three distinct sensors, each of which is configured to sense a different physical stimulus. In particular, the MEMS sensor device described below includes an inertial sensor adapted to sense motion (e.g., linear acceleration), a pressure sensor adapted to sense pressure, and a magnetic field sensor adapted to sense a magnetic field. However, in alternative embodiment, the sensors may be any combination of sensors adapted to sense different physical stimuli in accordance with particular design requirements.

Figure 11:
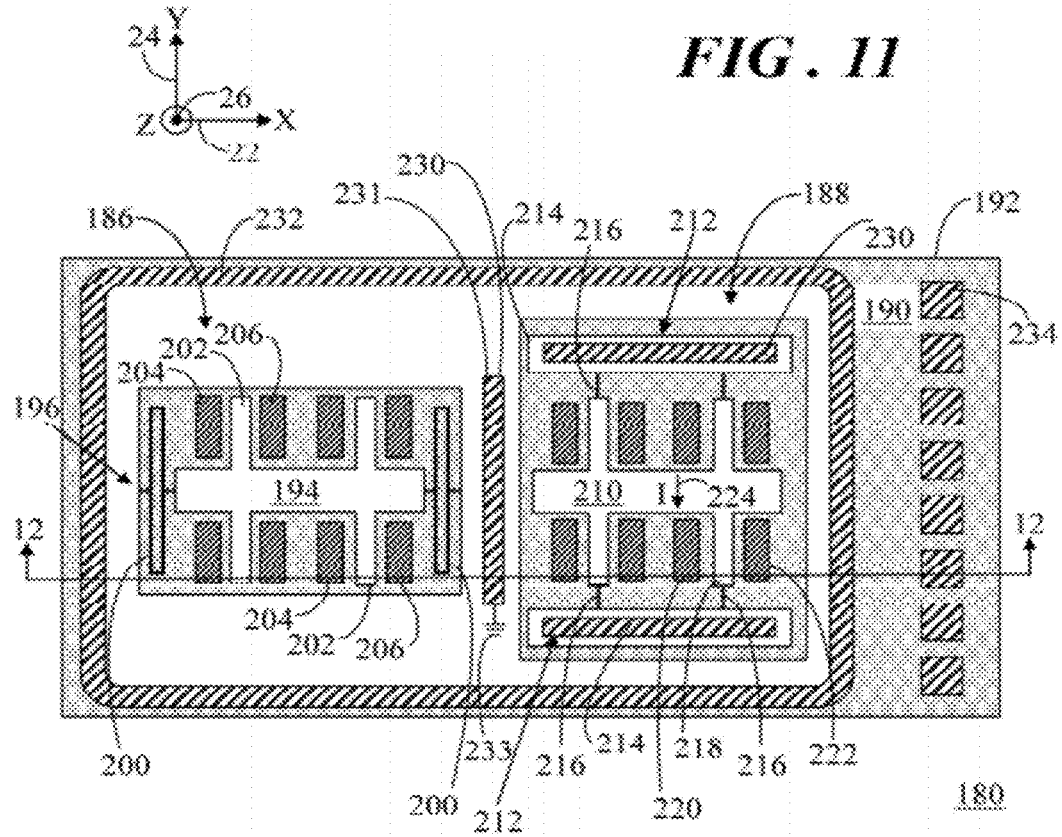
FIG. 11 shows a top view of a MEMS sensor portion of a multi-sensing MEMS sensor device in accordance with another alternative embodiment.
Figure 12:
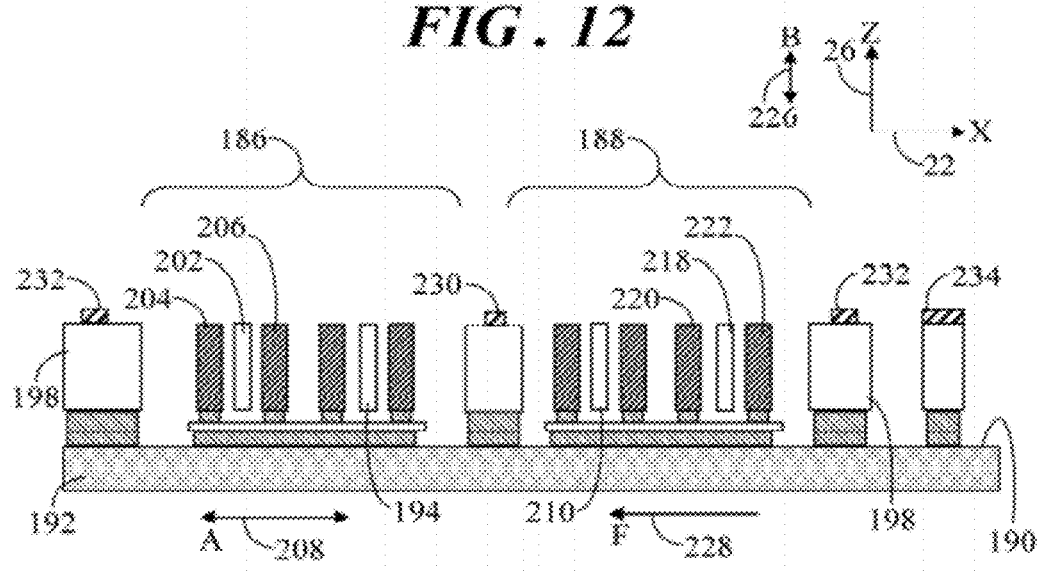
FIG. 12 shows a side view of the MEMS sensor portion of FIG. 11 along section line 12-12.
Figure 13:
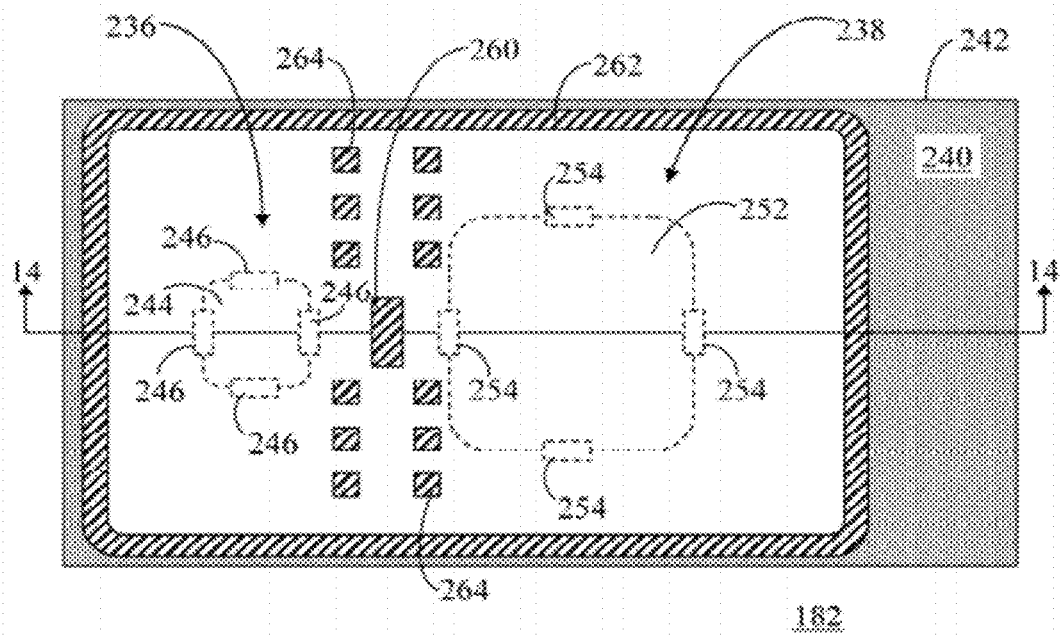
FIG. 13 shows a top view of another MEMS sensor portion of the multi-sensing MEMS sensor device.
Figure 14:
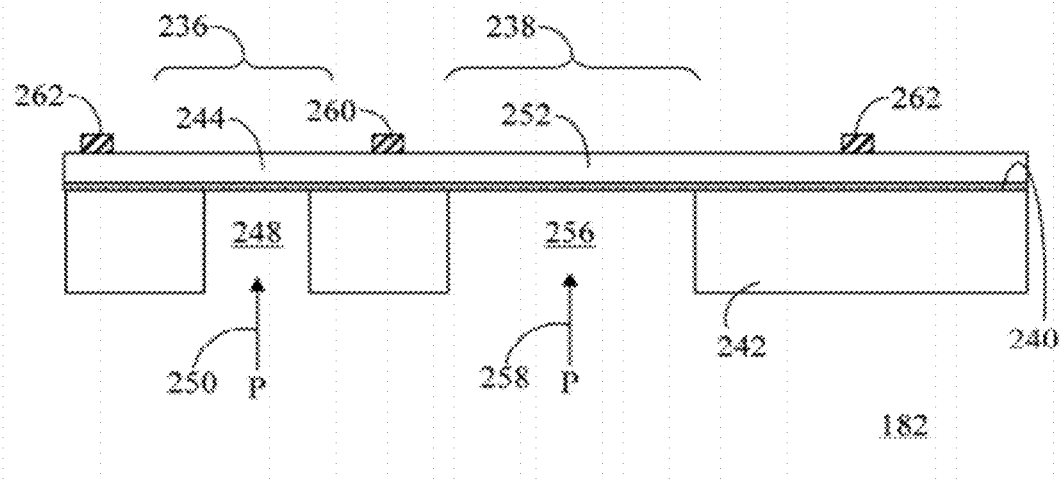
FIG. 14 shows a side view of the MEMS sensor portion of FIG. 13 along section line 14-14.
Figure 15:
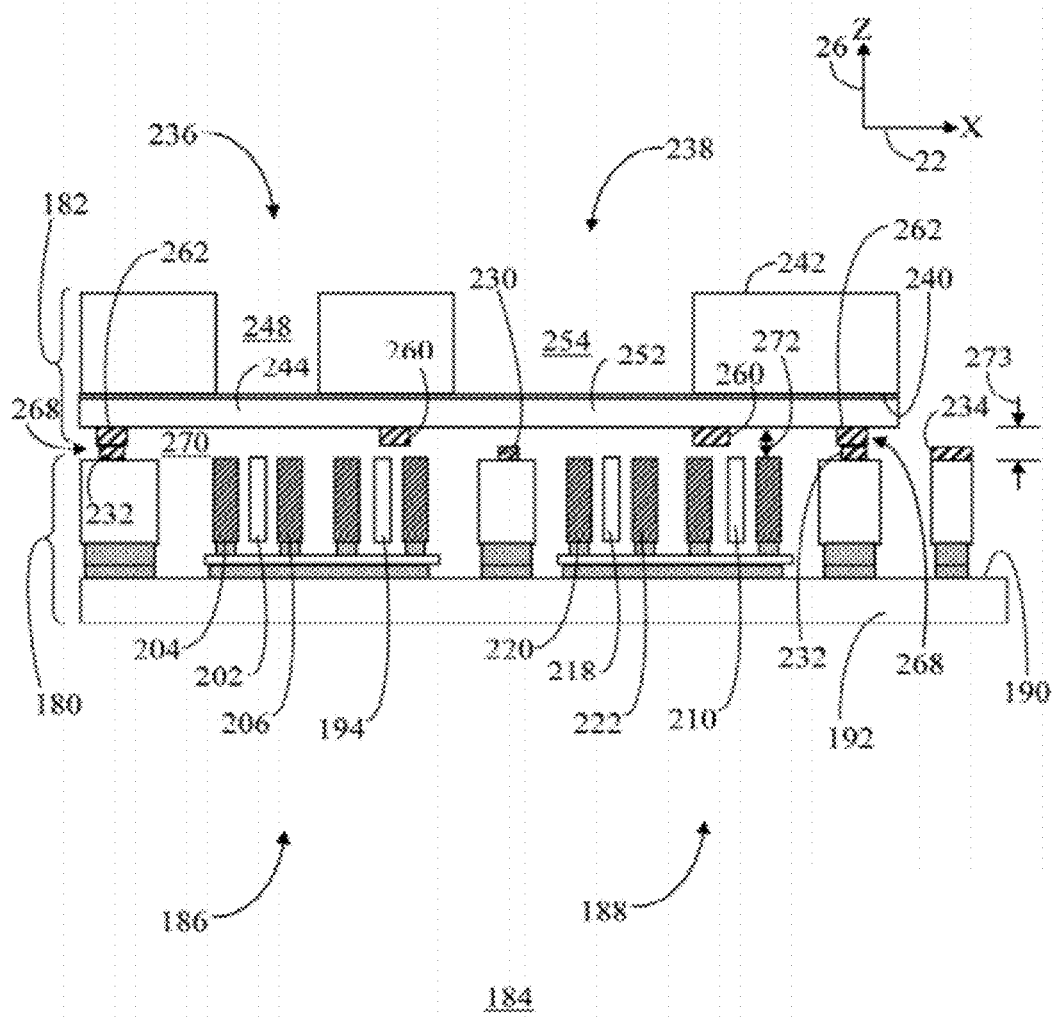
FIG. 15 shows a side view of a multi-sensing MEMS sensor device formed by coupling the sensor portions of FIG. 11 and FIG. 13.

FIGS. 11-12 illustrate a first MEMS sensor portion 180 of a multi-sensing MEMS sensor device in accordance with this alternative embodiment. FIGS. 13-14 illustrate a second MEMS sensor portion 182 of the multi-sensing MEMS sensor device in accordance with this alternative embodiment. FIG. 15 illustrates a multi-sensing MEMS sensor device 184 formed by integrating the first and second MEMS sensor portions 180 and 182, respectively. Each of the MEMS sensor portions 180 and 182 will first be described individually in connection with the figures in which they first appear. Then, the integration of MEMS sensor portions 180 and 182 will be discussed in connection with MEMS sensor device 184 of FIG. 15.

Referring to FIGS. 11-12, FIG. 11 shows a top view of MEMS sensor portion 180 of multi-sensing MEMS sensor device 184 (FIG. 15) and FIG. 12 shows a side view of MEMS sensor portion 180 along section line 12-12 in FIG. 11. MEMS sensor portion 180 may be formed through the execution of task 86 (FIG. 2) of fabrication process 84 (FIG. 2) using, for example, known and developing high aspect ratio micromachining processes.

MEMS sensor portion 180 includes sensors 186 and 188 disposed on a surface, or side 190, of a substrate 192. In the illustrated embodiment, sensor 186 is an inertial sensor adapted to sense a first physical stimulus, e.g., motion, and sensor 188 is a magnetic field sensor adapted to sense a second physical stimulus, e.g., a magnetic field. More specifically, sensor 186 may be a linear accelerometer that senses acceleration in X-direction 22. Thus, sensor 186 is referred to hereinafter as accelerometer 186 for clarity of discussion. Sensor 188 is adapted to sense a magnetic field in Z-direction 26, i.e., out of plane of substrate 192. Sensor 188 is referred to hereinafter as magnetic sensor 188 for clarity of discussion. Substrate 192 is shaded in FIGS. 11 and 12 to distinguish it from overlying structures and layers that are disposed on substrate 192.

Accelerometer 186 includes a movable element 194 spaced apart from, i.e., suspended above and positioned in spaced apart relationship above, side 190 of substrate 192 via an anchor system 196. Anchor system 196 movably couples movable element 194 to substrate 192. In an embodiment, anchor system 196 includes an anchor structure 198 formed on or coupled to side 190 of substrate 192. In an exemplary embodiment, movable element 194 is attached to anchor structure 198 by springs 200 that are compliant in one direction, i.e., X-direction 22. Thus, anchor system 196 enables movable element 194 to move substantially parallel to side 190 of substrate 192 in response to linear acceleration in X-direction 22.

Movable element 194 of accelerometer 186 includes movable electrodes, referred to herein as movable fingers 202. Each movable finger 202 is surrounded by a pair of fixed electrodes, referred to herein as fixed fingers 204 and 206 that are formed on, or otherwise attached to, side 190 of substrate 192. Fixed fingers 204 and 206 are in non-movable connection with substrate 192. That is, fixed fingers 204 and 206 do not move separate from substrate 192. Fingers 202, 204, and 206 are arranged perpendicular to X-direction 22 and form a differential capacitive structure for determining linear acceleration in X-direction 22.

When accelerometer 186 experiences linear acceleration, A, represented by an arrow 208, in X-direction 22, movable element 194 moves in X-direction 22 so that the distance between movable fingers 202 and the adjacent fixed fingers 204 and 206 changes, thus changing the capacitance between these fingers 202, 204, 206. This change in capacitance is registered by the sense circuitry (not shown) and converted to an output signal representative of the linear acceleration 208 in X-direction 22.

Magnetic sensor 188 includes a movable element 210 spaced apart from side 190 of substrate 192 via an anchor system 212 that includes anchor structures 214 formed on or coupled to side 190 of substrate 192. In an embodiment, movable element 210 is attached to anchor structures 214 by springs 216 that are compliant in X-direction 22 to enable motion of movable element 210 substantially parallel to side 190 of substrate 192. Movable element 210 of magnetic sensor 188 includes movable electrodes, referred to herein as movable fingers 218. Each of movable fingers 218 is surrounded by a pair of fixed electrodes, referred to herein as fixed fingers 220 and 222, that are formed on, or otherwise attached to, side 190 of substrate 192 so that fixed fingers 220 and 222 are in non-movable connection with substrate 192. Fingers 218, 220, and 222 are arranged perpendicular to X-direction 22.

In an embodiment, movable element 210 of magnetic sensor 188 carries an excitation current I, represented by an arrow 224. With the existence of a magnetic field 226 (B-field) in Z-direction 26, i.e. out of plane of substrate 192, a Lorentz force 228, F, will be produced as follows: $F=I\times B1$, where I is excitation current 224, B is the strength of magnetic field 226, and 1 is the conductor length. Due to the induced Lorentz force 228, movable element 210 will move in X-direction 22 so that the distance between movable fingers 218 and the adjacent fixed fingers 220 and 222 changes, thus changing the capacitance between these fingers 218, 220, and 222. This change in capacitance is registered by the sense circuitry (not shown) and converted to an output signal representative of magnetic field 226 in Z-direction 26.

In accordance with an embodiment of the invention, MEMS sensor portion 180 may include one or more over-travel stops 230. As discussed in connection with other embodiments, over-travel stops 230 may be formed on fixed portions of MEMS sensor portion 180, such as on fixed fingers 204, 206, 220, and 222, anchor structures 198 and 214, and the like. As illustrated, over-travel stops 230 are formed on and extend above a fixed region of MEMS sensor portion 180 so that they are in non-movable connection with side 190 of substrate 192. Once MEMS sensor portions 180 and 182 (FIG. 13) are coupled, over-travel stops 230 function to limit movement of a facing movable structure, discussed below, so that the movable structure cannot come into contact with movable elements 194 and 210 and/or fixed fingers 204, 206, 220, and 222 when MEMS sensor device 184 (FIG. 15) is subjected to harsh conditions in Z-direction 26 (FIG. 1). Over-travel stops 230 may be located in any location that is suitable for limiting movement of an overlying structure in accordance with the particular design configuration.

Since accelerometer 186 and magnetic sensor 188 convert physical stimuli into electrical signals, crosstalk between accelerometer 186 and magnetic sensor 188 can occur. Over-travel stop 230 may be formed in the illustrated elongated configuration of FIG. 11 using an electrically conductive material so that it will additionally or alternatively function as a shield trace 231, sometimes referred to as a shield runner, coupled to a ground terminal 233 and separating accelerometer 186 and magnetic sensor 188. Accordingly, over-travel stop 230 functioning as shield trace 231 will effectively suppress the cross-talk between accelerometer 186 and magnetic sensor 188. Of course, nothing requires the single structure to serve as both over-travel stop 230 and shield trace 231. Alternative embodiments may include dedicated shield traces 231 that are distinct from the over-travel stops 230.

MEMS sensor portion 180 may further include a seal ring 232, one or more internal connection sites (not shown), and one or more external connection sites 234 that are formed concurrently with other components of MEMS sensor portion 180. Seal ring 232 encircles accelerometer 186 and magnetic sensor 188 and defines the location at which MEMS sensor portion 180 will be coupled with MEMS sensor portion 182 (FIG. 15). Seal ring 232 serves as the bonding location for creating a hermetically sealed joint between MEMS sensor portions 180 and 182 (FIG. 15). The internal connection sites and external connection sites 234 are implemented to form electrical connections between MEMS sensor portion 180 and MEMS sensor portion 182 and/or between MEMS sensor portion 180 and external circuitry (not shown), as needed. In an embodiment, an electrically conductive material layer such as aluminum, copper, silver, gold, indium, alloys thereof, and compounds thereof may be appropriately patterned and etched to form seal ring 232, the internal connection sites, and external connection sites 234.

The fabrication of MEMS sensor portion 180 may include various patterning, deposition, and etching operations to concurrently form movable elements 194 and 210, anchor systems 196 and 212, fixed fingers 204, 206, 220, and 222, seal ring 232, the internal connection sites, external connection sites 234, and the like. For example, the fabrication of movable parts, such as movable elements 194 and 210, can entail the implementation of release layers, also known as sacrificial layers. That is, the movable elements 194 and 210 can be built by depositing a sacrificial layer (not shown), which is selectively removed at the locations where the future regions, e.g., anchor systems 196 and 212, will be attached to the underlying substrate. A structural layer is then deposited on top of the sacrificial layer and structured. The sacrificial layer is subsequently removed to release the movable parts, using a selective etch process that will not change the structural layer. In an embodiment, MEMS sensor portion 180 may be formed utilizing high aspect ratio micromachining processes to produce relatively tall microstructures with stiff, vertical sidewalls, i.e., relatively thick movable elements 194 and 210 and relatively thick fixed fingers 204, 206, 220, and 222. High aspect ratio micromachining processes can be utilized to form three-dimensional structures, having an aspect ratio greater than, for example, 5:1.

In the illustrated embodiment of MEMS sensor portion 180, accelerometer 186 and magnetic sensor 188 may be integrated on a single substrate 192 because the structural configuration of each, and therefore the fabrication methodology for each, is similar to one another. However, in alternative embodiments, MEMS sensor portion 180 may include only one of accelerometer 186 and magnetic sensor 188. And in still other embodiments, two or more sensors that sense disparate physical stimuli may be integrated onto a single substrate 192 provided they can be fabricated in a desired form factor using parallel processing steps and in a desired size.

Referring to FIGS. 13-14, FIG. 13 shows a top view of MEMS sensor portion 182 of multi-sensing MEMS sensor device 184 (FIG. 15), and FIG. 14 shows a side view of MEMS sensor portion 182 along section line 14-14 in FIG. 13. MEMS sensor portion 182 may be formed through the execution of task 88 (FIG. 2) of fabrication process 84 (FIG. 2) using, for example, known and developing semiconductor and micromachining processes.

In an exemplary embodiment, MEMS sensor portion 182 includes sensors 236 and 238 disposed on a surface, or side 240, of a substrate 242. In the illustrated embodiment, each of sensors 236 and 238 is a pressure sensor adapted to sense a physical stimulus that is different than the physical stimuli sensed by either of sensors 186 and 188 of MEMS sensor portion 180 (FIG. 11). More particularly, sensor 236 may be a pressure sensor configured to sense a first pressure range, for example, around one hundred kilopascals, from the external environment. Sensor 236 is referred to hereinafter as a first pressure sensor 236 for clarity of discussion. In the exemplary embodiment, sensor 238 may be a pressure sensor configured to sense a second pressure range, for example, around ten kilopascals. Sensor 238 is referred to hereinafter as a second pressure sensor 238. The terms "first" and 'second" are used herein to distinguish sensor 236 from sensor 238. It should be understood that sensors 236 and 238 can be two different ranges in accordance with particular design requirements, such as around nine hundred kilopascals, three thousand five hundred kilopascals, and so forth.

First pressure sensor 236 generally includes a movable element in the form of a diaphragm 244 disposed on side 240 of substrate 242, diffusion resistors 246 formed by ion implantation and diffusion in diaphragm 244, and a cavity 248 behind diaphragm 244 that is formed by etching or otherwise removing a portion of substrate 242. Diaphragm 244 can thus be exposed to a medium level pressure stimulus, represented by an arrow 250, from the external environment via cavity 248. Medium level pressure stimulus 250 causes distortion or strain of diaphragm 244, which may be formed of a monocrystalline silicon. An output signal corresponding to medium level pressure stimulus 250 can be generated based on a resistance value change of diffusion gauge resistors 246. This change in resistance can be registered by the sense circuitry (not shown) and converted to an output signal representative of medium level pressure stimulus 250.

Second pressure sensor 238 also includes a movable element in the form of a diaphragm 252 disposed on side 240 of substrate 242, diffusion resistors 254 formed by ion implantation and diffusion in diaphragm 252, and a cavity 256 behind diaphragm 252 that is formed by etching or otherwise removing a portion of substrate 242. Diaphragm 252 can thus be exposed to a low level pressure stimulus, represented by an arrow 258, from the external environment via cavity 256. Low level pressure stimulus 258 causes distortion or strain of diaphragm 252. An output signal corresponding to low level pressure stimulus 258 can be generated based a resistance value change of diffusion gauge resistors 254. This change in resistance can be registered by the sense circuitry (not shown) and converted to an output signal representative of low level pressure stimulus 258.

It should be observed that under certain pressure conditions, only one of first pressure sensor 236 and second pressure sensor 238 may produce an output signal in accordance with the external pressure being either medium level pressure stimulus 250 or low level pressure 258. Alternatively, diaphragms 244 and 252 may be appropriately configured so that they both can sense the same external pressure level.

The illustrated sensors 236 and 238 may be piezoresistive type sensors. A piezoresistive type sensor senses external pressure by means of a piezoresistance effect of the silicon diaphragm as the pressure detecting device. For example, the diffusion resistors are disposed on a diaphragm made of a material, for example, single crystal silicon, capable of providing the piezoresistance effect, and are connected into a bridge circuit. The pressure signal is taken out from the bridge circuit in accordance with changes in the resistance values of the diffusion resistors which are caused by displacement of the diaphragm.

Piezoresistive sensors are generally considered to be robust, easy to fabricate, and they produce an output signal proportional to the input with good linearity. Piezoresistive pressure sensors are additionally distinguished by high long-term stability, a wide operating temperature range, and a large measuring range in conjunction with low temperature dependence and high measurement dynamics. However, a correction circuit or a simplified processing circuit is typically added to the piezoresistive pressure sensor to overcome a poor temperature characteristic of the piezoresistive pressure sensor.

Although the illustrated embodiment includes piezoresistive pressure sensors, sensors 236 and 238 may alternatively be capacitive type sensors. A capacitive type sensor typically measures pressure by the capacitive changes resulting from variations in the distance between a movable diaphragm and a substrate that occur because of pressure changes. In a capacitive pressure sensor, an exterior pressure or stress, causes a change in a gap interposed between opposing electrodes, so that capacitance between the opposing electrodes is changed. The amount of the changed capacitance is then converted into an electrical signal, which involves with the magnitude of the stress or the pressure. Capacitive type sensors can be made highly accurate and repeatable, small in size, and they can readily be fabricated by surface micromachining Moreover, they consume less power then piezoresistive type sensors. However, capacitive type sensors have a non-linear direct output signal, they are more sensitive to electromagnetic interference, they are less robust than piezoresistive type sensors, and their pressure sensitive diaphragm needs to be protected against the pressure media by a gel or other flexible material in many applications.

Like MEMS sensor portion 180, MEMS sensor portion 182 may include one or more over-travel stops 260. Over-travel stops 260 are formed on and extend above a fixed region of MEMS sensor portion 182 so that they are in non-movable connection with side 240 of substrate 242. Once MEMS sensor portions 180 and 182 (FIG. 13) are coupled, over-travel stops 260 function to limit movement of a facing movable structure, in this configuration, movable element 194 and/or movable element 210 (FIG. 11), so that the movable structure cannot come into contact with diaphragm 244 or 252 when MEMS sensor device 184 (FIG. 15) is subjected to harsh conditions in Z-direction 26 (FIG. 1). Again, over-travel stops 260 may be located in any location that is suitable for limiting movement of a facing movable structure in accordance with the particular design configuration.

MEMS sensor portion 182 may further include a seal ring 262, one or more internal connection sites 264, conductive traces (not shown), and/or one or more external connection sites (not shown) that are formed concurrently with other components of MEMS sensor portion 182. Seal ring 262 encircles pressure sensors 236 and 238 and defines the location at which MEMS sensor portion 182 will be coupled with MEMS sensor portion 180 (FIG. 15) to create the hermetically sealed joint between MEMS sensor portions 180 and 182 (FIG. 15). An electrically conductive material layer such as aluminum, copper, silver, gold, indium, alloys thereof, and compounds thereof may be appropriately patterned and etched to form seal ring 262, internal connection sites 264, conductive traces, and/or the external connection sites. Internal connection sites 264, the conductive traces, and/or the external connections sites may be implemented to form electrical connections between MEMS sensor portion 180 and MEMS sensor portion 182 and/or between MEMS sensor portion 182 and external circuitry (not shown), as needed.

Fabrication methodology for MEMS sensor portion 182 entails various patterning, deposition, and etching operations to form diaphragms 244 and 252, diffusion resistors 246 and 254, seal ring 262, internal connection sites 264, external connection sites 266, and the like in accordance with conventional and developing semiconductor and surface micromachining processes. Advantageously, the most suitable process may be implemented for fabricating and controlling the thickness of diaphragms 244 and 252 for generating a predetermined electronic signal corresponding to an external pressure. The thickness of diaphragms 244 and 252 can be carefully controlled and optimized by implementing an appropriate semiconductor fabrication methodology for MEMS sensor portion 182 that is separate from the fabrication of MEMS sensor portion 180 (FIG. 11).

In the illustrated embodiment of MEMS sensor portion 182, first pressure sensor 236 and second pressure sensor 238 may be integrated on a single substrate 242 because the structural configuration of each, and therefore the fabrication methodology for each, is similar to one another. However, in alternative embodiments, MEMS sensor portion 182 may include only one of pressure sensors 236 and 238. And in still other embodiments, two or more sensors that sense disparate physical stimuli may be integrated onto a single substrate 242 provided they can be fabricated in a desired form factor using parallel processing steps.

FIG. 15 shows a side view of multi-sensing MEMS sensor device 184 formed by coupling the MEMS sensor portions 180 and 182. As discussed previously MEMS sensor portions 180 and 182 may be manufactured separately utilizing processes that are most suitable for the particular sensors 186, 188, 236, and 238. MEMS sensor device 184 may be formed through the execution of task 90 (FIG. 2) of fabrication process 84 (FIG. 2) using, for example, known and developing wafer bonding techniques.

The coupling of MEMS sensor portions 180 and 182 may be achieved by depositing sealing materials onto sensor portions 180 and 182 over, for example, seal rings 232 and 262. The sealing materials may be glass frit, aluminum, gold, and so forth. Next, substrates 196 and 242 are aligned in a high precision aligner in a face to face, i.e., side 190 to side 240, relationship. After alignment, substrates 196 and 242 are clamped in a bond fixture and loaded into a wafer bonder. The wafer bonder has a piston that applies force onto the vertically integrated stack of substrates 192 and 242, and a heater heats up substrates 196 and 242. The high force and high temperatures cause the sealing material at seal rings 232 and 262 to melt or otherwise go through a phase change to form a hermetically sealed joint 268.

Thus, a hermetically sealed chamber 270 is formed in which the functional components of each of sensors 186, 188, 190, and 192 are located. In addition, a portion of substrate 242 may be sawn or etched to reveal external connection sites 234. MEMS sensor device 184 may undergo further operations in accordance with conventional processes, such as wafer thinning, dicing, packaging, wirebonding to form external connections, testing and so forth, as discussed previously.

MEMS accelerometer 186 and magnetic sensor 188 require hermetically sealed chamber 270 to protect movable elements 194 and 210 and fixed fingers 204, 206, 220, and 222 from particles, moisture, and so forth. Pressure sensors 236 and 238 also require hermetically sealed chamber 270 in order to measure the pressure difference between the environment external to chamber 270 and the internal environment of chamber 270. The bonding, or fusion, of MEMS sensor portion 180 with MEMS sensor portion 182 efficiently enables the formation of a common chamber 270 for all of sensors 186, 188, 236, and 238.

Typical design requirements for pressure sensors, such as sensors 236 and 238, call for an internal pressure of chamber 270 that is substantially lower than one atmosphere, for example, in the milliTorr range, where one atmosphere equals seven hundred and sixty Torr. However, the design requirements for a MEMS accelerometer, such as accelerometer 186, typically call for a relatively high pressure, for example, one hundred to four hundred Torr, in order to have better overload and mechanical performance.

The pressure inside the wafer bonder when coupling MEMS sensor portions 180 and 182 is controlled by a mechanical pump so that the pressure inside of chamber 270, once hermetically sealed, can vary from vacuum to over-pressure as needed by design. In order to address the differing design requirements called for by sensors that sense different physical stimuli, one of two techniques may be implemented. In one embodiment, chamber 270 is sealed under low pressure, i.e., vacuum. This configuration yields an underdamped accelerometer 186 which will have mechanical stability problems. However, this stability issue can be addressed by incorporating a feedback control circuit that applies an electrostatic force so that movable element 194 will stay in a nominal position.

In an alternative embodiment, chamber 270 may be sealed under higher pressure, i.e., greater than vacuum. Due to this configuration, the pressure inside chamber 270 will vary with temperature and external pressure which can lead to inaccurate pressure detection. This issue can be addressed by the incorporation of a correction circuit so that pressure sensors 236 and 238 can output accurate pressure readings without being influenced by changes in the pressure of chamber 270. This correction circuit will be discussed below in connection with FIG. 16.

As shown in FIG. 15, following the coupling of MEMS sensor portion 182 with MEMS sensor portion 180, over-travel stops 230 are appropriately positioned to limit movement of diaphragm 252 in Z-direction 26 so as to prevent mechanical interference with structures of MEMS sensor portion 180. Although MEMS sensor portion 180 is illustrated with only one over-travel stop 230 for limiting the movement of diaphragm 252, in alternative embodiments, additional over-travel stops 230 may be implemented to additionally limit the movement diaphragm 244.

As further shown in FIG. 15, following the coupling of MEMS sensor portion 182 with MEMS sensor portion 180, over-travel stops 260 are appropriately positioned to limit movement of movable elements 194 and 210 in Z-direction 26 so as to prevent mechanical interference with the structures of MEMS sensor portion 182. It should be observed that over-travel stops 260 are positioned at a periphery of diaphragms 244 and 252 so that over-travel stops 260 will not interfere with the normal movement of diaphragms 244 and 252.

As discussed previously, over-travel stop 230 separating accelerometer 186 from magnetic sensor 188 may also be a shield trace capable of suppressing crosstalk between accelerometer 186 and magnetic sensor 188. Additionally, or alternatively, following coupling of MEMS sensor portion 180 with MEMS sensor portion 182, the structures of each are separated by a gap 272 having a height 273 sufficient to limit crosstalk between sensors 236 and 238 of MEMS sensor portion 182 and sensors 186 and 188 of MEMS sensor portion 180. By way of example, a thickness of corresponding seal rings 232 and 262 may function as a stand-off element of a height sufficient to produce the separation, i.e., gap 272, between sensors 236 and 238 of MEMS sensor portion 182 and sensors 186 and 188 of MEMS sensor portion 180. Such a height 273 of gap 272 may be, for example, eight micrometers.

And still additionally, or alternatively, the various movable elements of each of the sensors may be electrically coupled to a common ground, or electrical potential, terminal. More specifically, movable element 194, movable element 210, diaphragm 244, and diaphragm 252 may all be electrically coupled via conductive traces and/or vias (not shown) to a common electrical potential that serves as ground for MEMS sensor device 184. Each of sensors 186, 188, 236, and 238 is based on the charge flowing between different electrical nodes. By applying the same electrical potential to each of movable element 194, movable element 210, diaphragm 244, and diaphragm 252, the charge flowing between them will be eliminated, and therefore suppress crosstalk. Thus, various embodiments of MEMS sensor device 184 may implement any combination of the above-discussed means for eliminating or suppressing crosstalk between the various sensors in accordance with particular design specifications.

Figure 16:
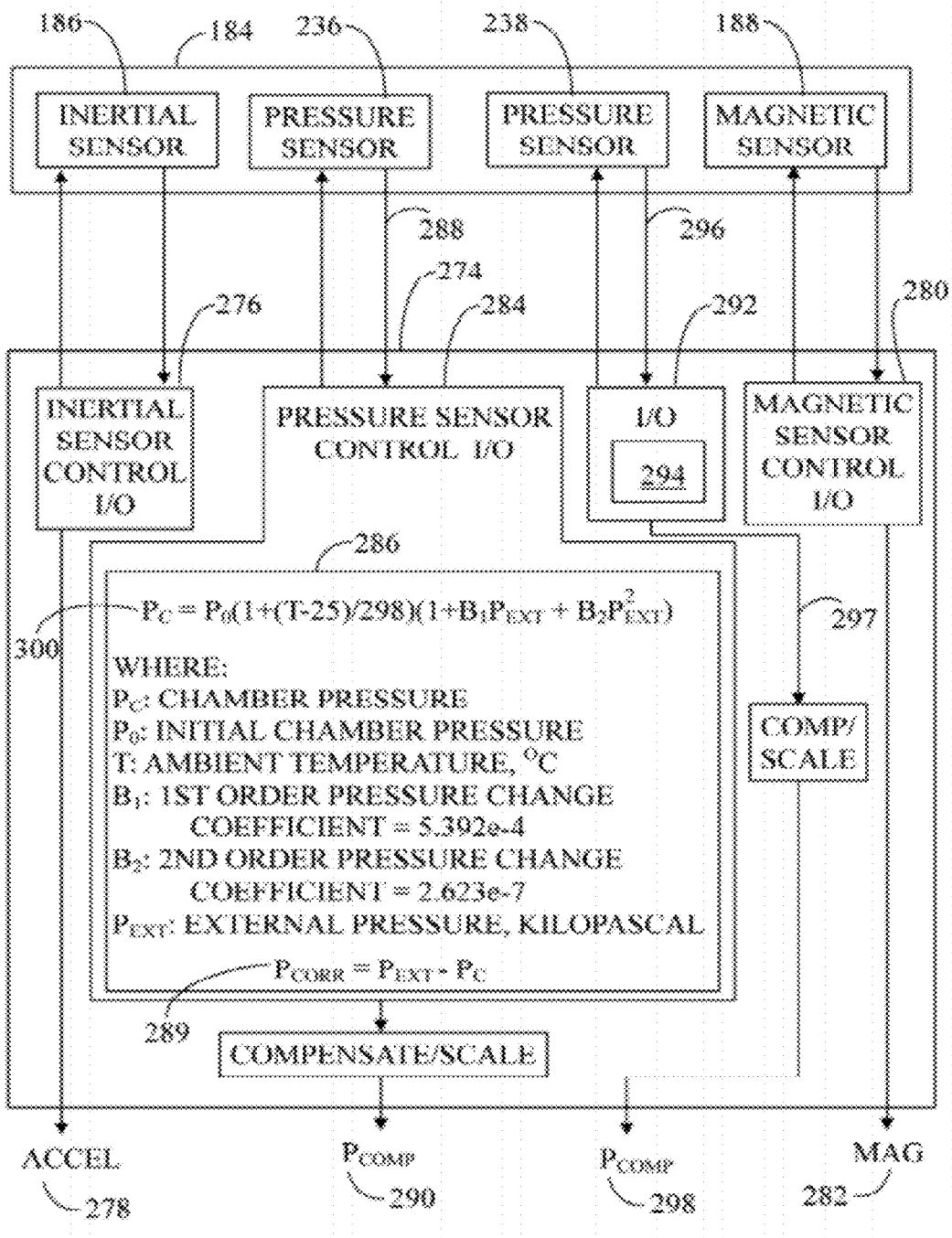
FIG. 16 shows schematic illustration of the multi-sensing MEMS sensor device coupled with a control input/output circuit.

FIG. 16 shows schematic illustration of the multi-sensing MEMS sensor device 184 coupled with a control input/output circuit 274. The inertial sensor, in this instance, accelerometer 186, of MEMS sensor device 184 is in communication with suitable inertial sensor control input/output circuitry 276 to produce an acceleration signal 278. Likewise, magnetic sensor 188 of MEMS sensor device 184 is in communication with suitable magnetic sensor control input/output circuitry 280 to produce a magnetic field signal 282. Suitable input/output circuitry for sensors 186 and 188 may entail capacitance-to-voltage conversion, analog-to-digital conversion, filtering, signal scaling, and the like as known to those skilled in the art.

First pressure sensor 236 is in communication with pressure sensor control input/output circuitry 284. Suitable pressure sensor input/output circuitry 284 for pressure sensor 236 may entail capacitance-to-voltage conversion, analog-to-digital conversion, filtering, signal scaling, and the like as known to those skilled in the art. Circuitry 284 may also include a specification compensation feature that compensates for the normal electrical values called for by specification.

As discussed briefly above, chamber 270 (FIG. 15) may be sealed under high pressure. i.e., greater than vacuum. Due to this configuration, the pressure inside chamber 270 varies with temperature and external pressure which can lead to inaccurate pressure readings. Accordingly, pressure sensor input/output circuitry 284 further includes a correction circuit 286. First pressure sensor 236 produces a pressure output signal 288 indicative of external pressure stimulus 250 (FIG. 14). Pressure output signal 288 includes an error signal component that is responsive to the variable pressure inside chamber 270. Correction circuit 286 functions to largely eliminate the error signal component in order to produce a corrected pressure signal, $P_{corr}$, 289. This corrected pressure signal 289 is further processed by conventional specification compensation to produce the appropriately compensated and scaled pressure signal, $P_{comp}$, 290.

Likewise, second pressure sensor 238 is in communication with pressure sensor control input/output circuitry 292 that includes, among the other conventional features mentioned above, a correction circuit 294. Second pressure sensor 238 produces a pressure output signal 296 indicative of external pressure stimulus 258 (FIG. 14). Pressure output signal 296 includes an error signal component that is also responsive to the variable pressure inside chamber 270. Thus, correction circuit 294 functions to largely eliminate this error signal component in order to produce a corrected pressure signal, $P_{corr}$, 297 which is further processed to produce the appropriately compensated and scaled pressure signal, $P_{comp}$, 298.

Details of correction circuit 284 for first pressure sensor 236 are provided below. However, the details of correction circuit 294 are not provided for brevity. Rather, it should be readily apparent that the teachings of correction circuit 284 apply equivalently to correction circuit 294. Correction circuits 284 and 294 may be formed as hardware, software, or a combination of hardware and software. Furthermore, correction circuits 284 and 294 may be separate elements or combined to form a single component for correcting each of pressure signals 288 and 296 in response to a change in the internal pressure of chamber 270.

Chamber pressure, $P_c$, of chamber 270 varies with temperature and external pressure, $P_{EXT}$, in accordance with the well known "gas law," $P_c V = nRT$. Where V is the volume of chamber 270, T is the temperature, and R is the gas constant. In an example, MEMS sensor portions 180 and 182 were bonded at 2280 Torr to yield an initial chamber pressure, $P_0$, of approximately 400 Torr, and chamber 270 is four micrometers. An equation 300 is derived by applying the gas law to the actual geometry of chamber 270. Equation 300 illustrates that the variation of chamber pressure, $P_c$, can be described in polynomial functions which can be trimmed or adjusted by a polynomial trim algorithm that encompasses equation 300 in correction circuit 284. Thus, correction circuit 284 makes adjustments for temperature variation (linear) and external pressure effect (second order) to produce corrected pressure, $P_{corr}$, 289 as a difference between the external pressure, $P_{EXT}$, and the actual chamber pressure, $P_c$, computed through the execution of equation 300. As a result, through the incorporation of correction circuits 284 and 294, pressure sensors 236 and 238 can output accurate pressure readings without being influenced by changes in temperature and chamber pressure.

An embodiment described herein comprises a compact MEMS acceleration transducer that includes two sensors in a vertically integrated, or stacked, configuration. Embodiments of the acceleration transducer may include sensing along one, two, or three mutually orthogonal axes. Multiple axis sensing can be adapted to detect movement in two orthogonal axes that are parallel to a planar surface of the transducer, as well as to detect movement in an axis that is perpendicular to the planar surface of the transducer. In addition, the acceleration transducer may be adapted to detect movement at different acceleration sensing ranges, for example, low-g, medium-g, high-g, or any combination thereof. Another embodiment of the invention further includes fabrication methodology for a vertically integrated, or stacked, acceleration transducer. Such an acceleration transducer is formed by separately fabricating two sensors and subsequently bonding the two sensors to create an acceleration transducer capable of sensing along the one, two, or three axes at the same or at different acceleration sensing ranges.

Another embodiment described herein comprises a compact MEMS sensor device that includes at least two sensors in a vertically integrated, or stacked, configuration capable of sensing diverse physical stimuli, such as motion, pressure, magnetic field, and so forth. The various sensors on substrates can have different material properties and can be fabricated using the same or different MEMS technology processes. The integration of two or more sensors vertically results in smaller die area and enables the efficient production of a hermetically sealed chamber. Package stress is a common problem to MEMS sensors. The integration of multiple sensors into a single package allows all of the sensors to benefit from the same package stress relief measure, such as through the application of low stiffness module coating materials. In addition, direct metal bonding between two MEMS sensor portions can reduce the parasitic capacitance and resistance, which can improve circuit performance.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A microelectromechanical systems (MEMS) sensor device comprising:
    a first substrate having a first side;
    a first sensor disposed on said first side and configured to sense a first physical stimulus;
    a second substrate having a second side, said second substrate being coupled to said first substrate to form a hermetically sealed chamber with said second side facing said first side; and
    a second sensor disposed on said second side, said first sensor and said second sensor being located in said hermetically sealed chamber with said second sensor situated facing said first sensor, said second sensor being configured to sense a second physical stimulus, said second physical stimulus differing from said first physical stimulus.

2. A MEMS sensor device as claimed in claim 1 wherein:
    said first sensor comprises an inertial sensor, and said first physical stimulus is motion; and
    said second sensor comprises a pressure sensor, and said second physical stimulus is pressure.

3. A MEMS sensor device as claimed in claim 1 further comprising a third sensor disposed on said first side of said first substrate and configured to sense a third physical stimulus, said third physical stimulus differing from said first physical stimulus and said second physical stimulus.

4. A MEMS sensor device as claimed in claim 3 wherein:
    said first sensor comprises an inertial sensor, and said first physical stimulus is motion;
    said second sensor comprises a pressure sensor, and said second physical stimulus is pressure; and
    said third sensor comprises a magnetic sensor, and said third physical stimulus is a magnetic field.

5. A MEMS sensor device as claimed in claim 3 further comprising a shield trace interposed between said first and third sensors and coupled to a ground terminal to limit crosstalk between said first and third sensors.

6. A MEMS sensor device as claimed in claim 1 wherein said first sensor is spaced apart from said second sensor by a gap having a height sufficient to limit crosstalk between said first sensor and said second sensor.

7. A MEMS sensor device as claimed in claim 1 further comprising a stand-off element interposed between a periphery of said first and second substrates, said stand-off element having a height that produces a separation between said first and second substrates so that said first sensor is spaced apart from said second sensor by a gap.

8. A MEMS sensor device as claimed in claim 1 wherein:
    said first sensor includes a first movable element; and
    said second sensor includes a second movable element, said first and second movable elements being electrically coupled to a common electrical potential terminal.

9. A MEMS sensor device as claimed in claim 1 wherein:
said hermetically sealed chamber exhibits a chamber pressure that is variable in response to an ambient temperature and an external pressure outside of said chamber;
said second sensor is a pressure sensor having a diaphragm that moves in response to a change in said external pressure to produce a pressure output signal indicative of said change in said external pressure; and
said MEMS sensor device further comprises a correction circuit in communication with said pressure sensor for receiving said pressure output signal and producing a corrected pressure signal to compensate for an error signal component in said pressure output signal.

10. A MEMS sensor device as claimed in claim 1 wherein:
said first sensor includes a movable element; and
said MEMS sensor device further comprises an over-travel stop positioned between said movable element and said second sensor, said over-travel stop being in non-movable connection with one of said first and second sides, said over-travel stop being adapted to limit movement of said movable element in a direction perpendicular to said first and second sides of said first and second substrates.

11. A MEMS sensor device as claimed in claim 10 wherein:
said movable element is a first movable element;
said over-travel stop is a first over-travel stop;
said second sensor includes a second movable element; and
said MEMS sensor device further comprises a second over-travel stop positioned between said second movable element and said first sensor, said second over-travel stop being in non-movable connection with one of said first and second sides, said second over-travel stop being adapted to limit movement of said second movable element in said direction perpendicular to said first and second sides of said first and second substrates.

12. A method of producing a microelectromechanical systems (MEMS) sensor device comprising:
forming a first sensor on a first side of a first substrate, said first sensor being adapted to sense a first physical stimulus, said first sensor including a first movable element that is movable relative to said first side;
forming a second sensor on a second side of a second substrate, said second sensor being adapted to sense a second physical stimulus, said second physical stimulus differing from said first physical stimulus, said second sensor including a second movable element that is movable relative to said second side; and
after forming said first and second sensors, coupling said second substrate with said first substrate to form a hermetically sealed chamber such that said second side faces said first side, said first sensor and said second sensor being located in said hermetically sealed chamber, and said second movable element is situated facing said first movable element.

13. A method as claimed in claim 12 wherein:
said forming said first sensor forms said first sensor as an inertial sensor such that said first physical stimulus is motion;
said forming said second sensor forms said second sensor as a pressure sensor such that said second physical stimulus is pressure.

14. A method as claimed in claim 13 wherein:
said forming said first sensor comprises forming a third sensor on said first side of said first substrate as a magnetic sensor concurrent with forming said first sensor, said magnetic sensor being configured to sense a magnetic field.

15. A microelectromechanical systems (MEMS) sensor device comprising:
a first substrate having a first side;
a first sensor disposed on said first side and configured to sense a first physical stimulus, said first sensor including a movable element adapted to move in response to said first physical stimulus;
a second substrate having a second side, said second substrate being coupled to said first substrate with said second side facing said first side to form a hermetically sealed chamber;
a second sensor disposed on said second side and situated facing said first sensor, said second sensor being configured to sense a second physical stimulus, said second physical stimulus differing from said first physical stimulus, and said first and second sensors being located in said chamber; and
an over-travel stop positioned between said movable element and said second sensor, said over-travel stop being in non-movable connection with one of said first and second sides, said over-travel stop being adapted to limit movement of said movable element in a direction perpendicular to said first and second sides of said first and second substrates.

16. A MEMS sensor device as claimed in claim 15 wherein:
said first sensor comprises an inertial sensor, and said first physical stimulus is motion; and
said second sensor comprises a pressure sensor, and said second physical stimulus is pressure.

17. A MEMS sensor device as claimed in claim 15 further comprising a third sensor disposed on said first side of said first substrate and configured to sense a third physical stimulus, said third physical stimulus differing from said first physical stimulus and said second physical stimulus.

18. A MEMS sensor device as claimed in claim 17 wherein:
said first sensor comprises an inertial sensor, and said first physical stimulus is motion;
said second sensor comprises a pressure sensor, and said second physical stimulus is pressure; and
said third sensor comprises a magnetic sensor, and said third physical stimulus is a magnetic field.

* * * * *